(12) United States Patent
Lu et al.

(10) Patent No.: US 12,520,553 B2
(45) Date of Patent: Jan. 6, 2026

(54) FORMING SEAMS WITH DESIRABLE DIMENSIONS IN ISOLATION REGIONS

(71) Applicant: Taiwan Semiconductor Manufacturing Co., Ltd., Hsinchu (TW)

(72) Inventors: Bo-Cyuan Lu, New Taipei (TW); Tai-Chun Huang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 815 days.

(21) Appl. No.: 17/651,677

(22) Filed: Feb. 18, 2022

(65) Prior Publication Data
US 2023/0114191 A1 Apr. 13, 2023

Related U.S. Application Data

(60) Provisional application No. 63/254,793, filed on Oct. 12, 2021.

(51) Int. Cl.
*H10D 64/01* (2025.01)
*H10D 30/01* (2025.01)
(Continued)

(52) U.S. Cl.
CPC ....... *H10D 64/017* (2025.01); *H10D 30/0243* (2025.01); *H10D 84/013* (2025.01);
(Continued)

(58) Field of Classification Search
CPC ............. H10D 64/017; H10D 30/0243; H10D 84/013; H10D 84/0151; H10D 84/0158; H10D 84/038; H10D 30/6211; H10D 84/834; H10D 30/797; H10D 30/024; H10D 30/6219; H10D 62/82; H10D 62/822; H10D 84/0149; H10D 62/021; H10D 62/115
See application file for complete search history.

(56) References Cited

U.S. PATENT DOCUMENTS 8,288,289 B2   10/2012   Jeong et al.
9,608,062 B1 *  3/2017   Tseng ................ H10D 30/6211
(Continued)

FOREIGN PATENT DOCUMENTS

DE   102020119859 A1   11/2021
DE   102020120265 A1   10/2024
(Continued)

*Primary Examiner* — Jeff W Natalini
*Assistant Examiner* — Nicholas Leland Hutson
(74) *Attorney, Agent, or Firm* — Slater Matsil, LLP

(57) ABSTRACT

A method includes forming a first dummy gate stack on a protruding semiconductor fin, etching the first dummy gate stack to form a trench, extending the trench downwardly to penetrate through a portion of the protruding semiconductor fin, and filling the trench with a dielectric material to form a fin isolation region. A seam is formed in the fin isolation region, and the seam extends to a level lower than a top surface level of the protruding semiconductor fin. The seam has a top width smaller than about 1 nm. A second dummy gate stack on the protruding semiconductor fin is replaced with a replacement gate stack.

20 Claims, 27 Drawing Sheets

(51) Int. Cl.
  *H10D 84/01*  (2025.01)
  *H10D 84/03*  (2025.01)
  *H10D 30/62*  (2025.01)
  *H10D 84/83*  (2025.01)

(52) U.S. Cl.
  CPC ..... *H10D 84/0151* (2025.01); *H10D 84/0158* (2025.01); *H10D 84/038* (2025.01); *H10D 30/6211* (2025.01); *H10D 84/834* (2025.01)

(56) References Cited

U.S. PATENT DOCUMENTS

| | | | |
|---|---|---|---|
| 10,636,886 B2 | 4/2020 | Jo et al. | |
| 10,868,139 B2 | 12/2020 | Lin et al. | |
| 11,043,492 B2* | 6/2021 | Liao | H10D 84/0188 |
| 11,145,752 B2 | 10/2021 | Feng et al. | |
| 11,437,277 B2 | 9/2022 | Ko et al. | |
| 11,837,505 B2 | 12/2023 | Ko et al. | |
| 2018/0025944 A1* | 1/2018 | Cheng | H01L 23/535 |
| | | | 257/382 |
| 2019/0074211 A1 | 3/2019 | Min et al. | |
| 2019/0305099 A1 | 10/2019 | Jo et al. | |
| 2020/0006126 A1* | 1/2020 | Liou | H01L 21/76825 |
| 2020/0286891 A1* | 9/2020 | Subramanian | H10D 84/853 |
| 2021/0083072 A1 | 3/2021 | Feng et al. | |
| 2022/0102554 A1* | 3/2022 | Guttman | H01L 21/02603 |
| 2022/0336608 A1* | 10/2022 | Yang | H10D 64/01 |

FOREIGN PATENT DOCUMENTS

| | | |
|---|---|---|
| KR | 20110088984 A | 8/2011 |
| KR | 20190026213 A | 3/2019 |
| KR | 20190112910 A | 10/2019 |
| KR | 20190142273 A | 12/2019 |
| KR | 20210033388 A | 3/2021 |

\* cited by examiner

FORMING SEAMS WITH DESIRABLE DIMENSIONS IN ISOLATION REGIONS

PRIORITY CLAIM AND CROSS-REFERENCE

This application claims the benefit of the following provisionally filed U.S. Patent application: Application No. 63/254,793, filed on Oct. 12, 2021, and entitled "Using ALD or CVD SiN to Create Specific Seam in the Trench to Achieve Leakage Isolation and K-Value Reduction," which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs includes forming long semiconductor fins and long gate stacks, and then forming isolation regions to cut the long semiconductor fins and long gate stacks into shorter portions, so that the shorter portions may act as the fins and the gate stacks of FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
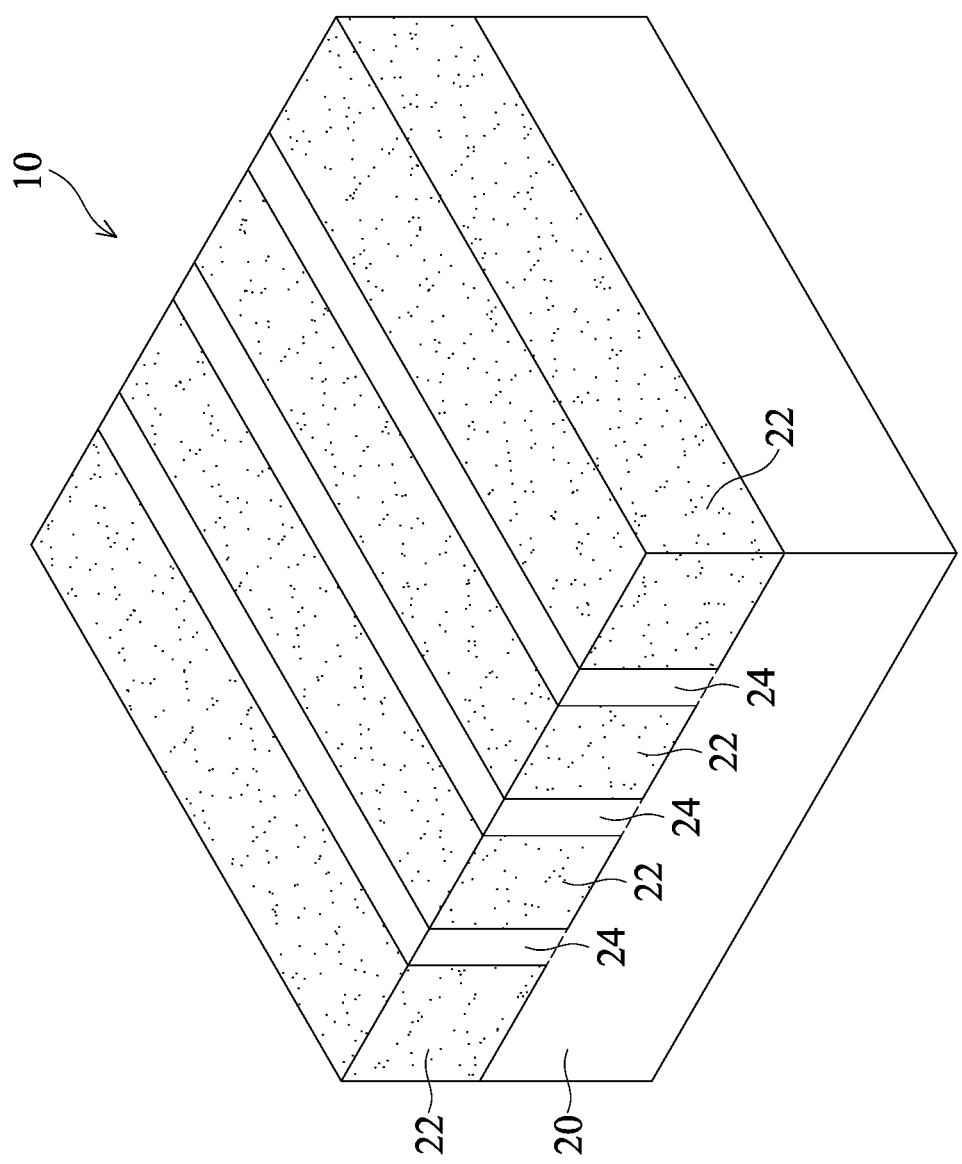
FIGS. 1-5, 6A, 6B, 7A, 7B, 7C, 8A, 8B, 8C and 9-20 illustrate the cross-sectional views, perspective views, and top views of intermediate stages in the formation of Fin Field-Effect Transistors (FinFETs) incorporating fin isolation regions with seams in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation regions, Fin Field-Effect Transistors (FinFETs), and the method of forming the same are provided in accordance with some embodiments. The formation of the fin isolation regions may include etching parts of a wafer to form trenches, and filling the trenches with dielectric layers. Processes for filling the trenches are adjusted, so that seams are formed in the isolation regions. The seams may have widths that are small enough so that the seams are not expanded in subsequent processes, and are not filled with conductive materials. The seam having a low dielectric constant (k value) of 1, and hence the leakage currents between features on the opposite sides of the isolation regions are reduced. Furthermore, the likelihood of filling continuous conductive features into the seams to cause leakage and/or electrical shorting is also reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-5, 6A, 6B, 7A, 7B, 7C, 8A, 8B, 8C and 9-20 illustrate the cross-sectional views, perspective views, and top views of intermediate stages in the formation of FinFETs and isolation regions in accordance with some embodiments of the present disclosure. The corresponding processes are also reflected schematically in the process flow shown in FIG. 22.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
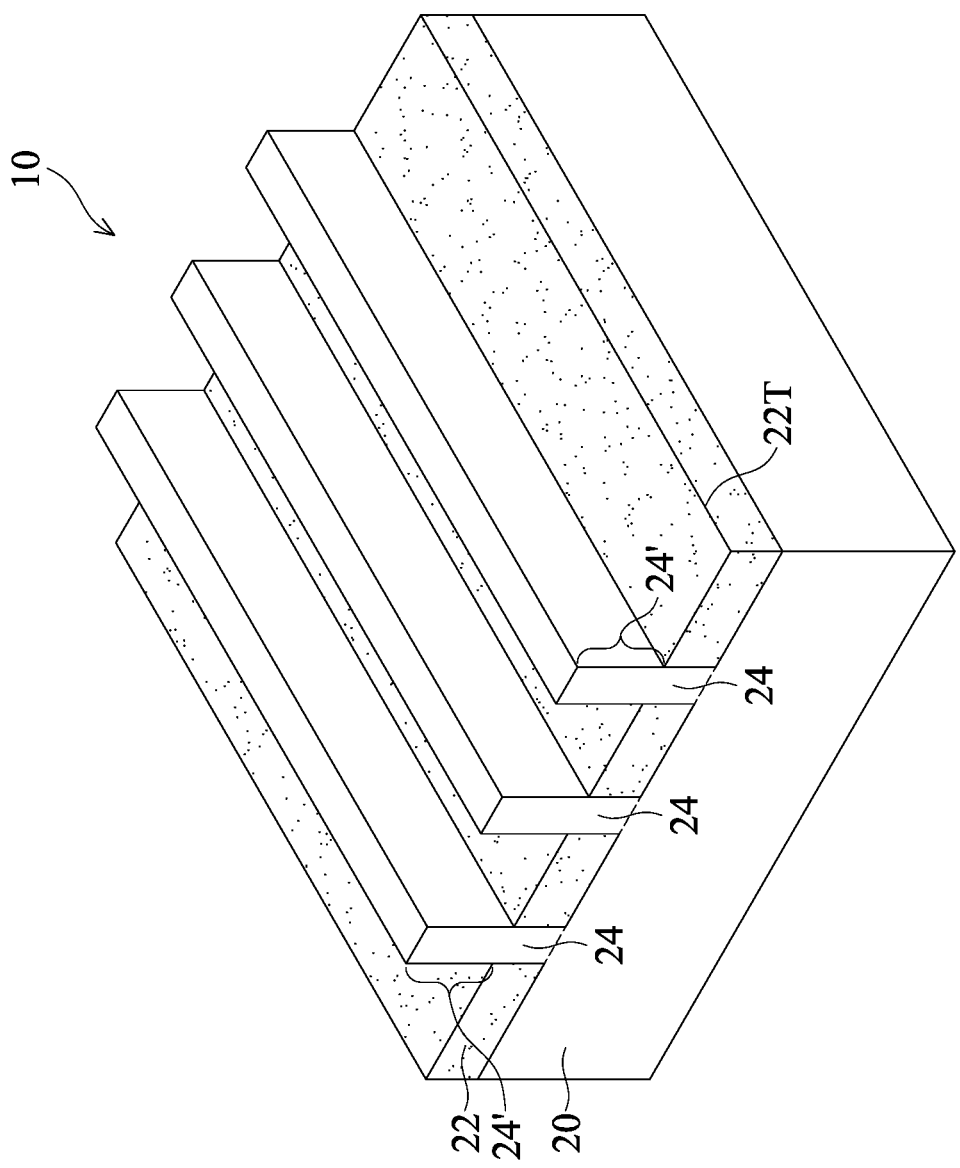
Figure 22:
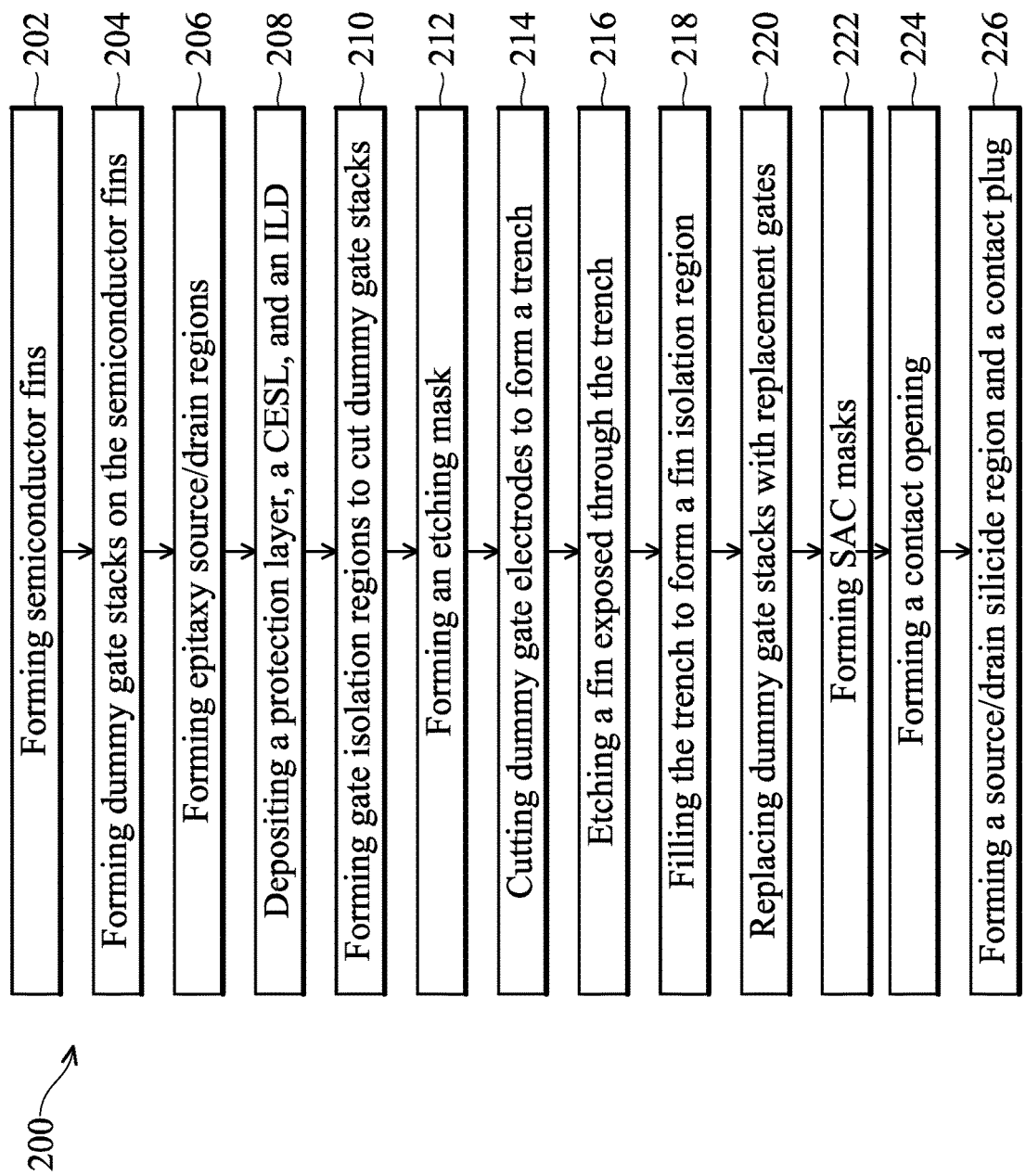
FIG. 22 illustrates a process flow for forming FinFETs and an isolation region in accordance with some embodiments.

Referring to FIG. 2, STI regions 22 are recessed, so that the top portions of semiconductor strips 24 protrude higher than the top surfaces 22T of the remaining portions of STI regions 22 to form protruding fins 24'. The respective process is illustrated as process 202 in the process flow 200 as shown in FIG. 22. The etching may be performed using a dry etching process, wherein HF and $NH_3$ are used as the etching gases. During the etching process, plasma may be generated. Argon may also be included. In accordance with alternative embodiments of the present disclosure, the recessing of STI regions 22 is performed using a wet etching process. The etching chemical may include HF, for example.

Figure 3:
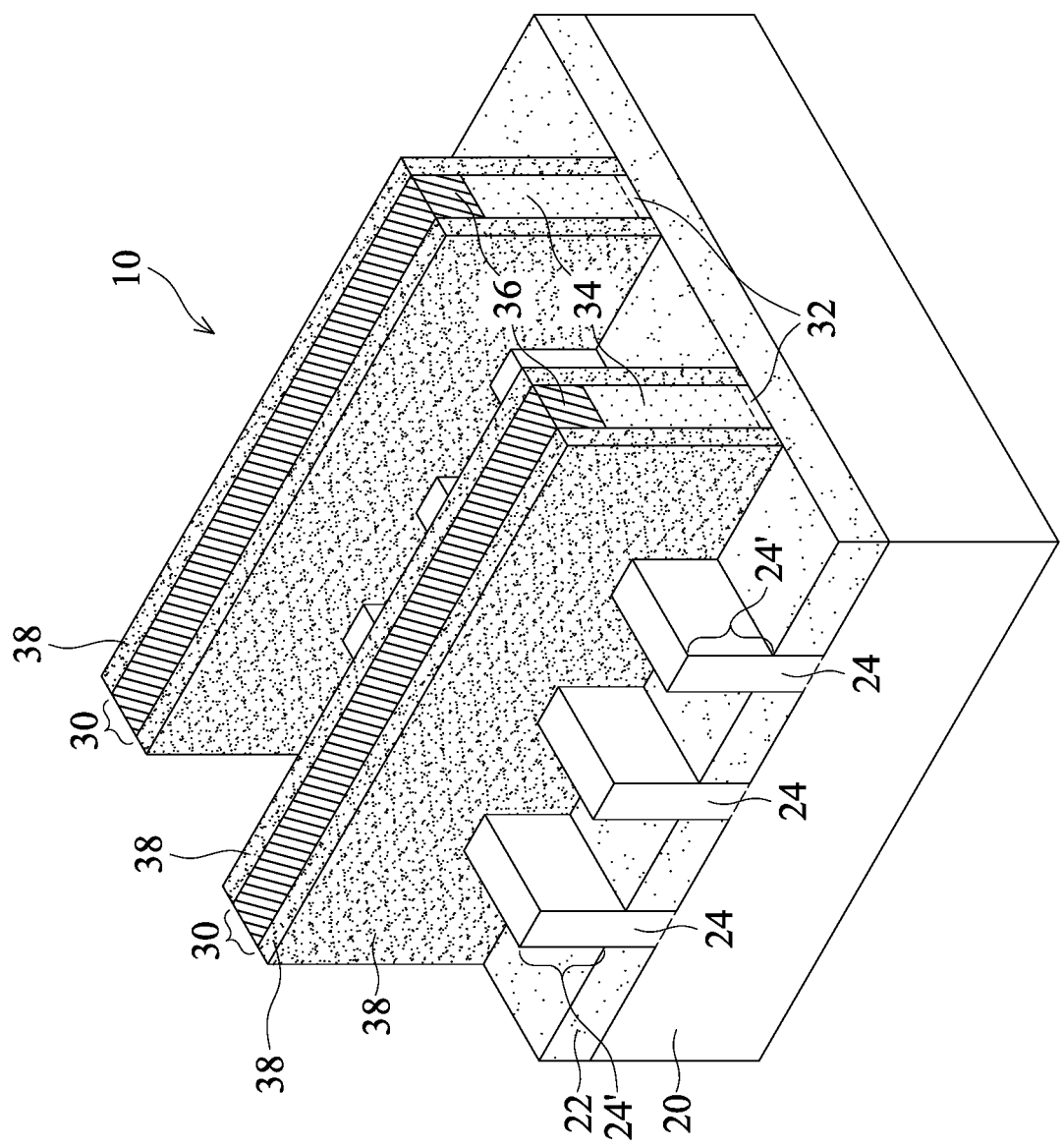

Referring to FIG. 3, dummy gate stacks 30 are formed on the top surfaces and the sidewalls of (protruding) fins 24'. The respective process is illustrated as process 204 in the process flow 200 as shown in FIG. 22. Dummy gate stacks 30 may include dummy gate dielectrics 32 and dummy gate electrodes 34 over dummy gate dielectrics 32. Dummy gate dielectrics 32 may be formed through thermal oxidation, deposition, or the like, and may be formed of or comprise silicon oxide, for example. When dummy gate dielectrics 32 are formed through oxidation, they may not be visible in the illustrated cross-section. Accordingly, dummy gate dielectrics 32 are shown as being dashed to indicate that they may, or may not, be visible.

Dummy gate electrodes 34 may be formed, for example, using polysilicon or amorphous silicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a plurality of protruding fins 24' and STI regions 22. Dummy gate stacks 30 also have lengthwise directions perpendicular to the lengthwise directions of protruding fins 24'. In accordance with some embodiments, the sidewalls of dummy gate stacks 30 are made as vertical as possible.

Next, gate spacers 38 are formed on the sidewalls of dummy gate stacks 30. In accordance with some embodiments of the present disclosure, gate spacers 38 are formed of a dielectric material such as silicon nitride, silicon carbo-nitride, or the like, and may have a single-layer structure or a multi-layer structure including a plurality of dielectric layers. While not shown, fin spacers may also be formed on the sidewalls of protruding fins 24' when gate spacers 38 are formed.

Figure 4:
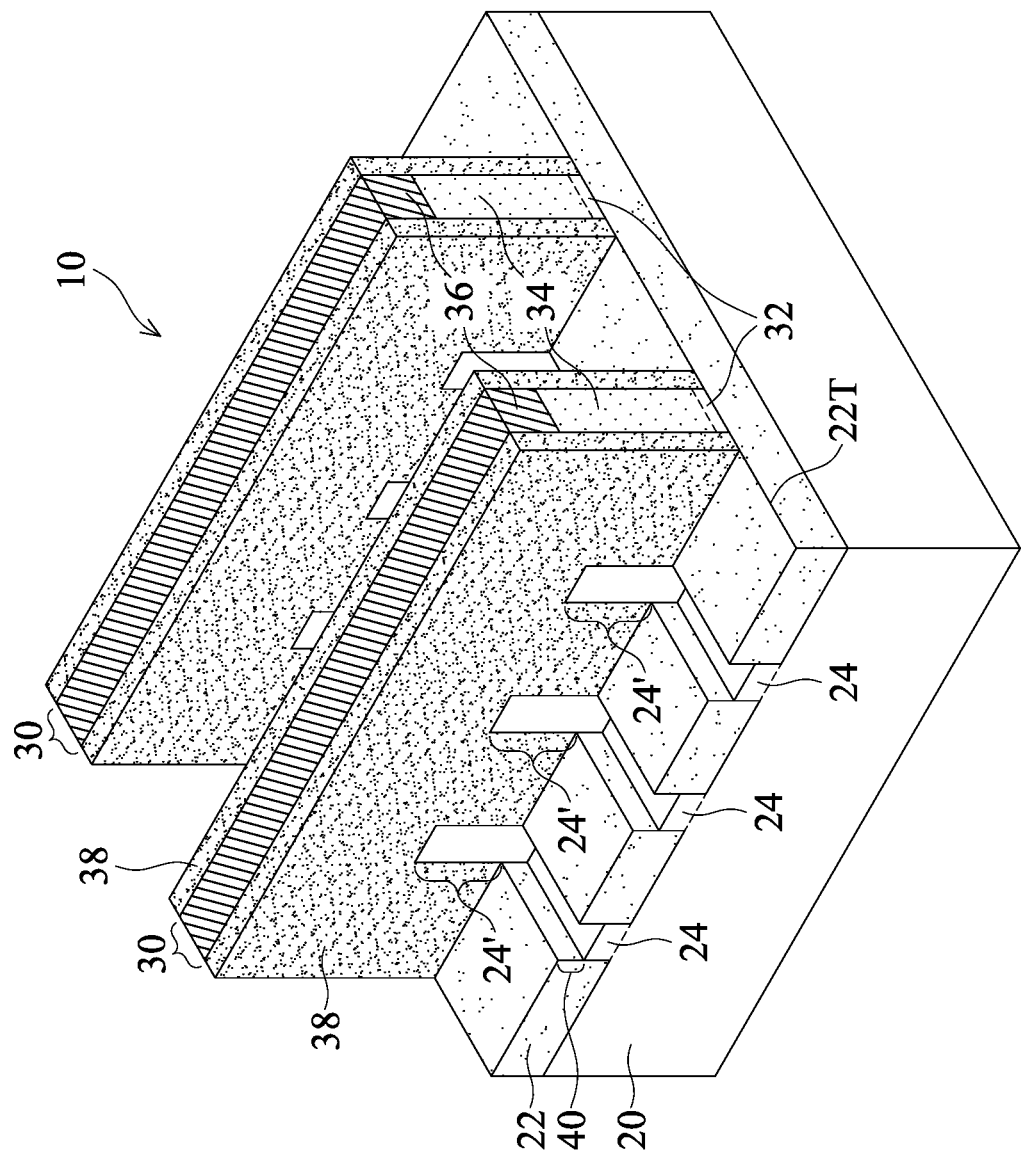

An etching process is then performed to etch the portions of protruding fins 24' that are not covered by dummy gate stacks 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22T of STI regions 22 in accordance with some embodiments. Recesses 40 are accordingly formed between STI regions 22. Recesses 40 are located on the opposite sides of dummy gate stacks 30.

Figure 5:
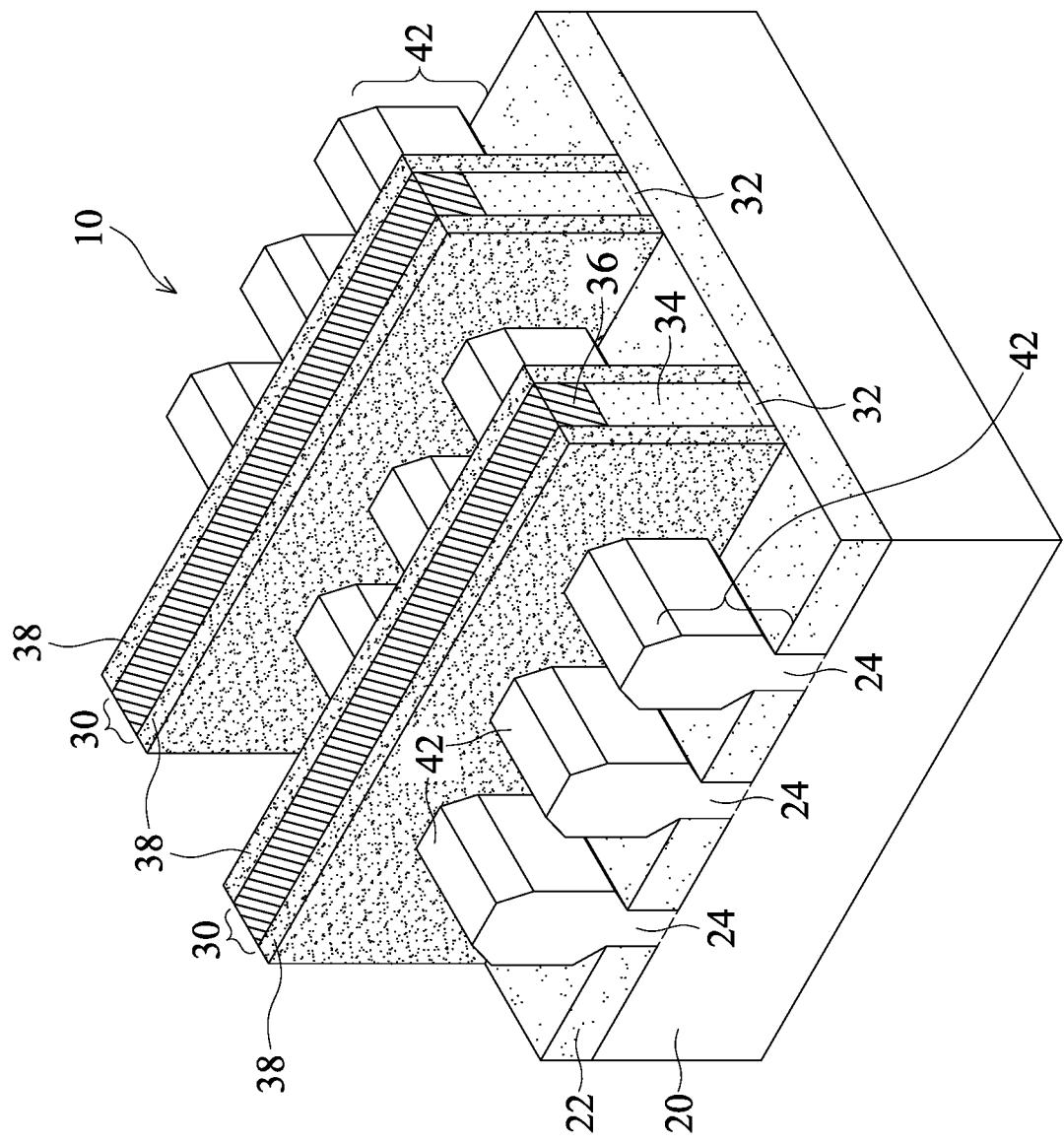

Next, epitaxy regions (source/drain regions) 42 are formed by selectively growing a semiconductor material from recesses 40, resulting in the structure in FIG. 5. The respective process is illustrated as process 206 in the process flow 200 as shown in FIG. 22. In accordance with some embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof.

After epitaxy regions 42 fully fill recesses 40, epitaxy regions 42 start expanding horizontally, and facets may be formed. The neighboring epitaxy regions 42 may be merged or remain separated from each other when the epitaxy process is finished, depending on the spacing between neighboring epitaxy regions 42, and depending on the specification of the resulting FinFETs.

Figure 6A:
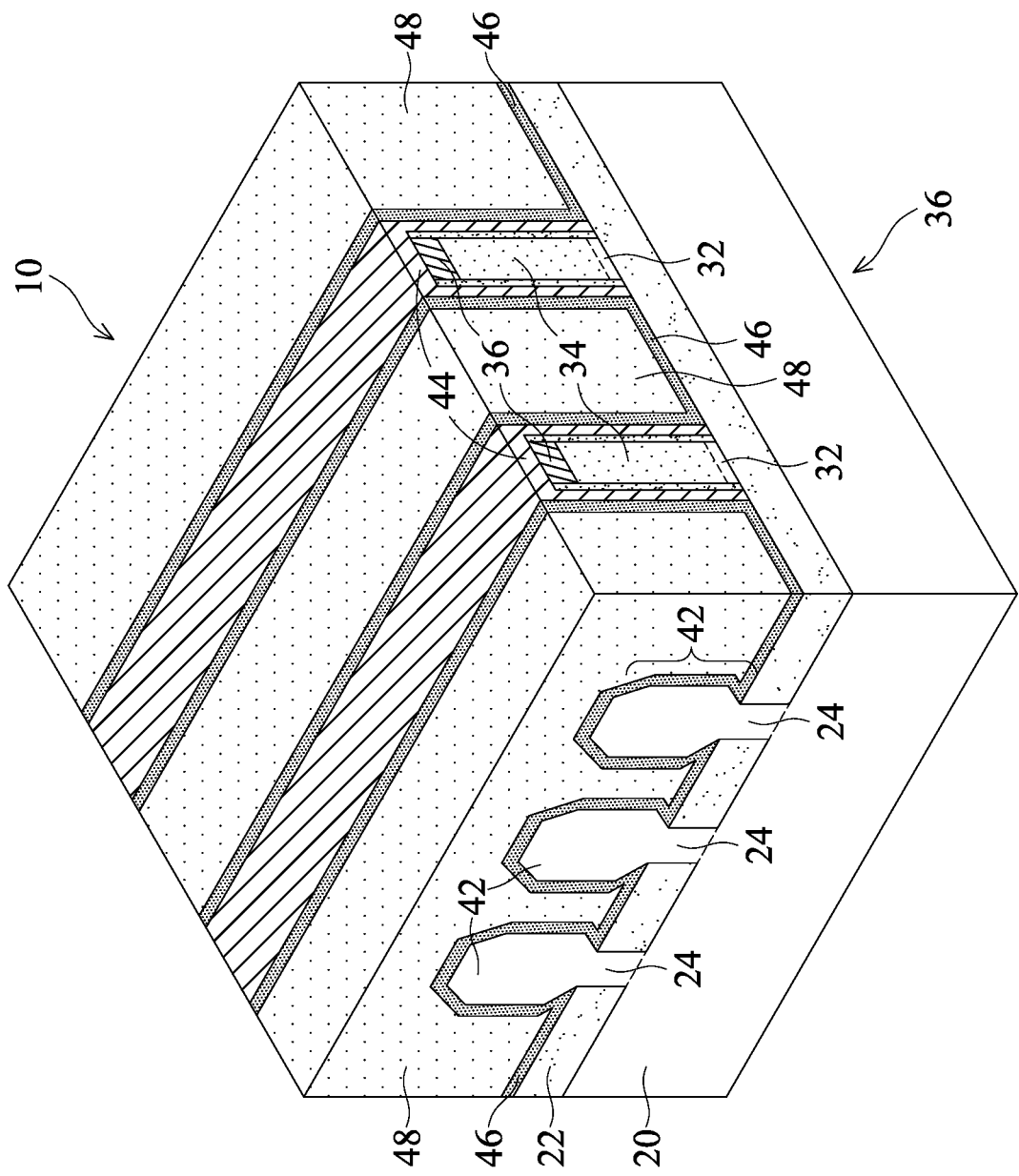

FIG. 6A illustrates a perspective view of the structure after the formation of protection layer 44, Contact Etch Stop Layer (CESL) 46, and Inter-Layer Dielectric (ILD) 48. The respective process is illustrated as process 208 in the process flow 200 as shown in FIG. 22. In accordance with some embodiments, protection layer 44 is formed on the sidewalls of gate spacers 38, and may, or may not, extend on the top surfaces of gate stacks 30. Alternatively, protection layer 44 is not formed. In accordance with some embodiments, protection layer 44 is formed through selective deposition, and is deposited on the sidewalls of gate spacers 38, but not on the top surface of source/drain regions 42 (refer to FIG. 5). Alternatively, protection layer 44 is formed through a blanket deposition process to form a conformal layer, followed by an anisotropic etching process to remove its horizontal portions. In accordance with some embodiments, protection layer 44 is formed of a dielectric material comprising silicon nitride, silicon oxynitride, silicon carbo-nitride, or the like.

CESL 46 may be formed through a conformal deposition process such as an ALD process or a CVD process, for example. CESL 46 may be formed of or comprise silicon oxide, silicon nitride, silicon oxynitride, or the like. ILD 48 may include a dielectric material formed using, for example, FCVD, spin-on coating, CVD, or another deposition method. ILD 48 may also be formed of an oxygen-containing dielectric material, which may be silicon-oxide based, and may include silicon oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48. In accordance with some embodiments in which protection layer 44 is formed and extends on the top surfaces of gate stacks 30, protection layer 44 may be used as a CMP stop layer for the planarization process. In accordance with alternative embodiments, hard masks 36 are used as CMP stop layers for the planarization process.

Figure 6B:
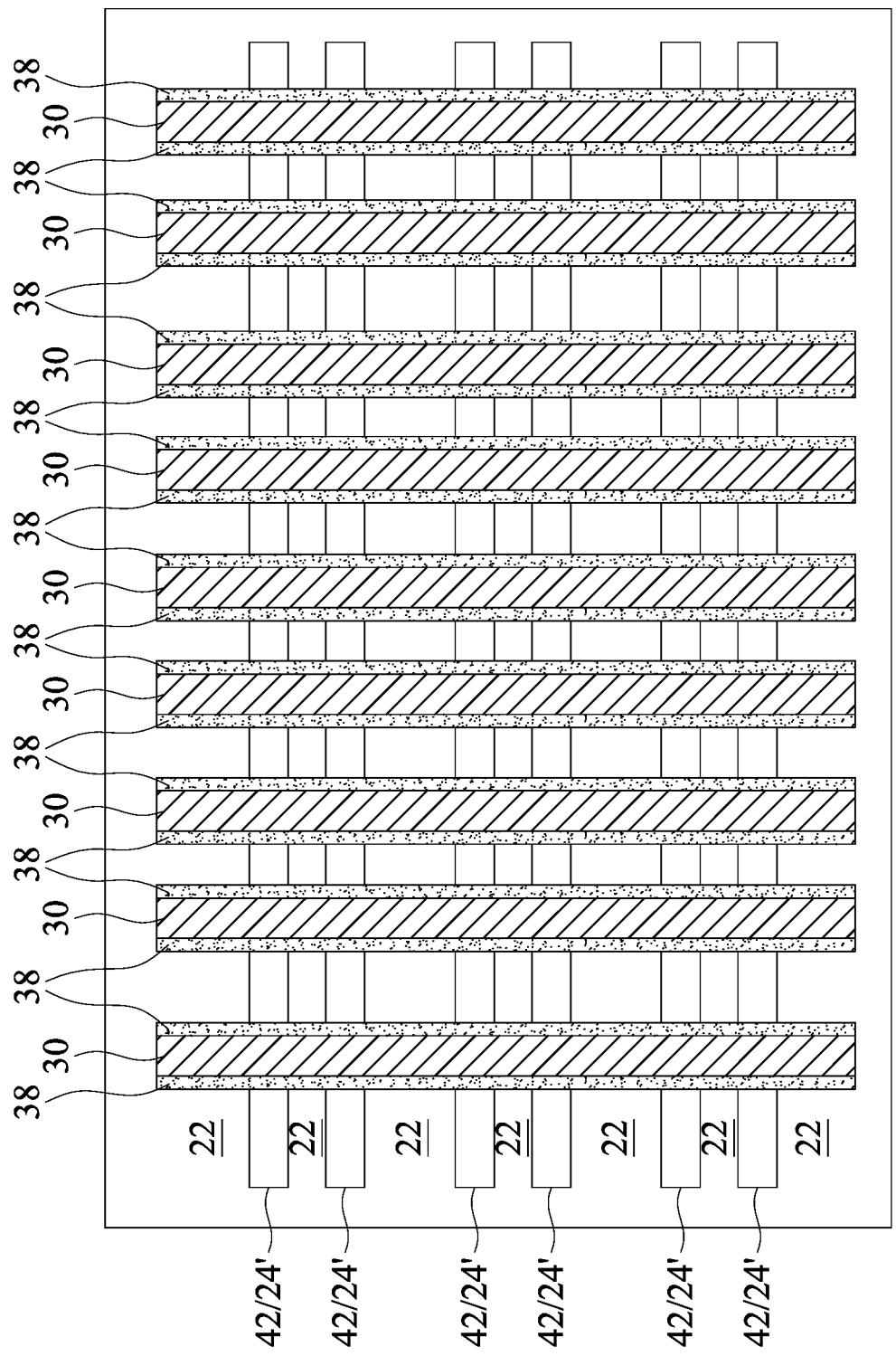

FIG. 6B illustrates a top view of dummy gate stacks 30, gate spacers 38, source/drain regions 42, and protruding fins 24' in accordance with some embodiments. The corresponding protruding fins 24' are directly underlying dummy gate stacks 30 and gate spacers 38, while source/drain regions are between dummy gate stacks. Source/drain regions 42 and the corresponding protruding fins 24' may be aligned to a plurality of straight lines, and dummy gate stacks 30 are formed as a plurality of straight strips, with the lengthwise directions of the dummy gate stacks 30 being perpendicular to the straight lines to which source/drain regions are aligned. The protection layers 44, CESL 46, and ILD 48 are not illustrated.

Figure 7A:
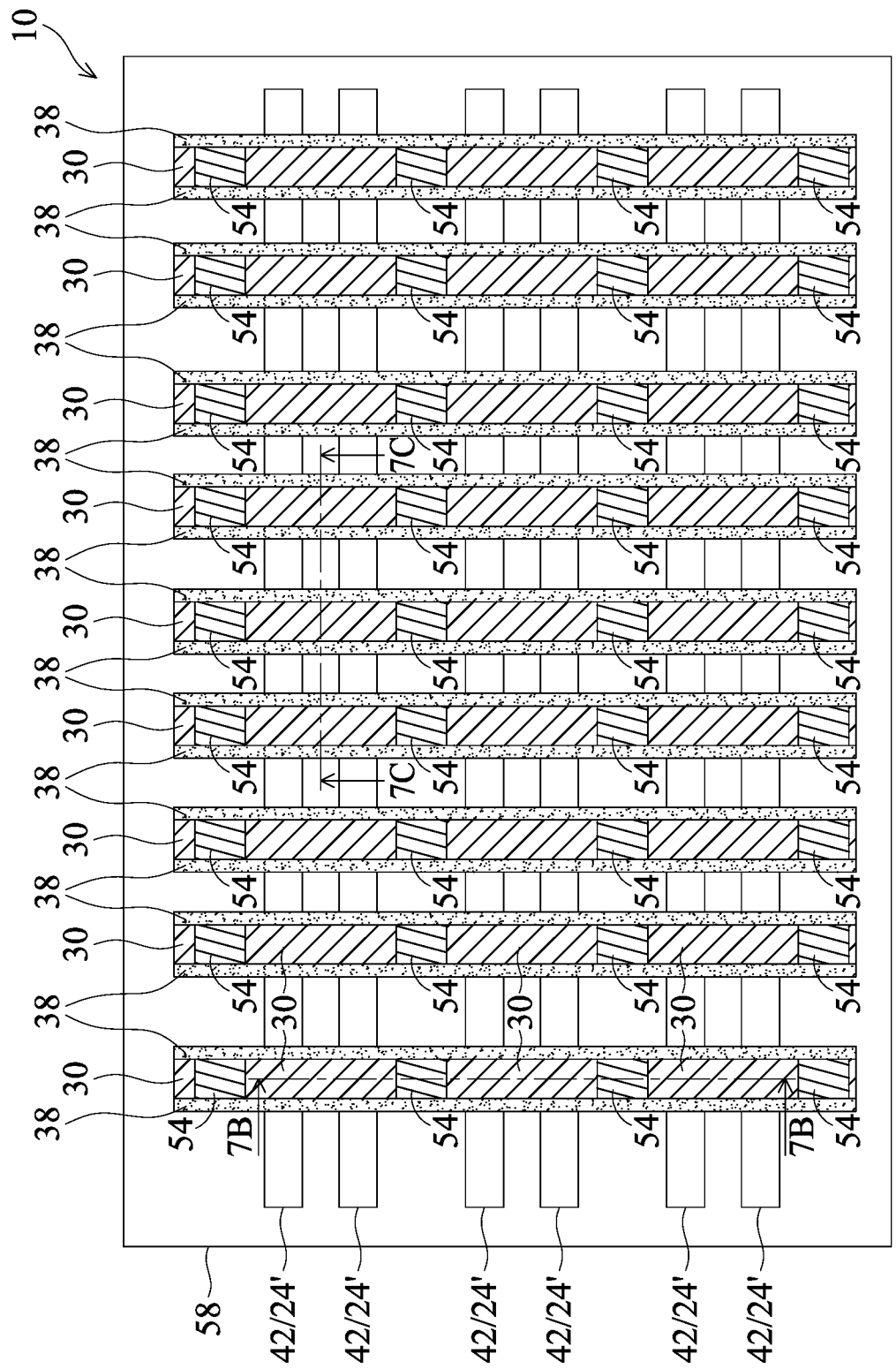
Figure 7B:
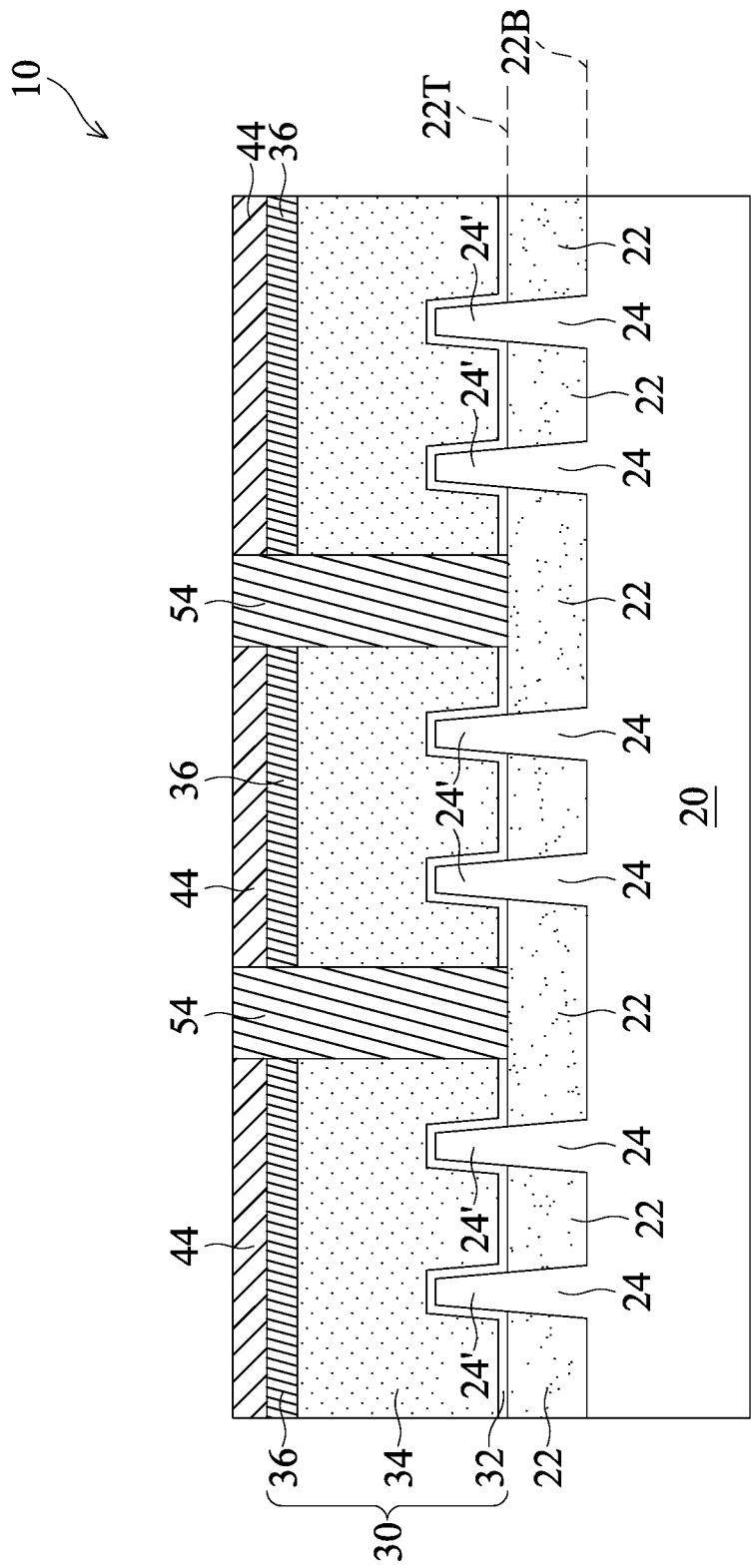
Figure 7C:
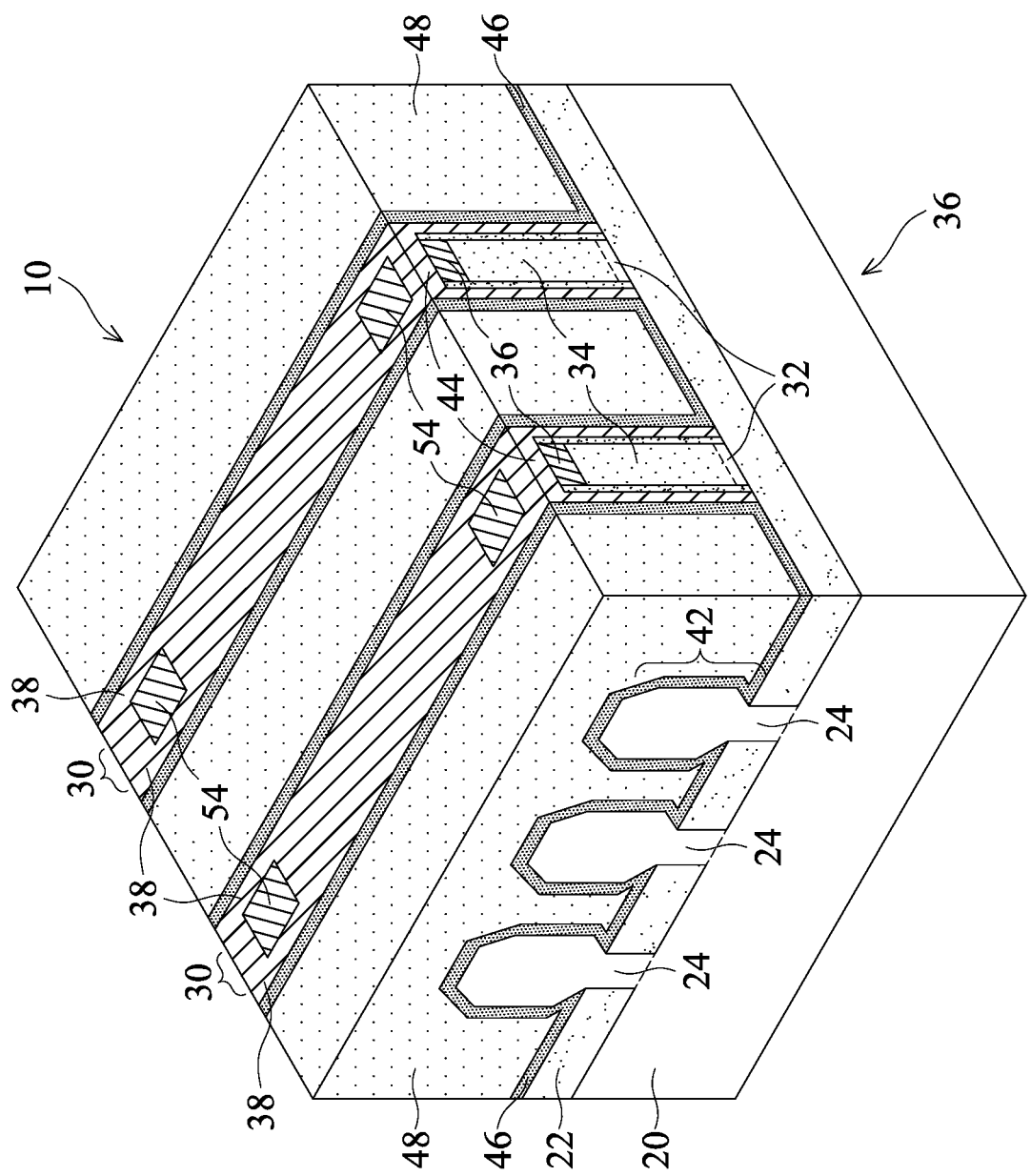

In subsequent processes, the long dummy gate stacks 30 are cut apart to form shorter dummy gate stacks, and gate isolation regions are formed to separate the shorter dummy gate stacks 30 from each other. The cutting of dummy gate stacks 30 is shown in FIGS. 7A, 7B, and 7C, and is alternatively referred to as a cut-poly process since the dummy gate electrodes in the dummy gate stacks may be formed of polysilicon. Furthermore, the protruding fins 24' are also cut apart, and fin isolation regions are formed to separate the protruding fins. The cutting of the protruding fins 24' is shown in FIGS. 8A, 8B, 8C, and 9-12, and is alternatively referred to as a Continuous Poly On Diffusion Edge (CPODE) process, or a Cut-Poly on OD Edge (CPODE) process. With the formation of the gate isolation regions and the fin isolation regions, individual FinFETs may be electrically isolated as needed. The FinFETs may be electrically interconnected through overlying contact plugs, vias, metal lines, etc., to form functional circuits. In the illustrative cut-poly and CPODE processes, some examples of the cutting positions are illustrated. It is appreciated that the cutting processes may be performed at different positions and with different sizes, depending on the requirement of the transistors.

FIGS. 7A, 7B, and 7C illustrate a top view, a cross-sectional view, and a perspective view, respectively, in the formation of gate isolation regions 54. The respective process is illustrated as process 210 in the process flow 200 as shown in FIG. 22. The cross-sectional view shown in FIG. 7B is obtained from cross-section 7B-7B in FIG. 7A. The top surfaces 22T and bottom surfaces 22B of STI regions 22 are illustrated in FIG. 7B. In accordance with some embodiments for forming the gate isolation regions 54, the elongated gate stacks as shown in FIG. 6B are first cut. For example, an etching mask such as a photo resist may be formed and then patterned, and openings are formed in the etching mask, while other parts of the illustrated regions are covered by the etching mask.

In a subsequent process, the portions of the dummy gate stacks 30 exposed through the openings are etched to extend the openings into dummy gate stacks 30. The etching may be stopped on the top surfaces 22T of STI regions 22 (as shown in FIG. 7B) in accordance with some embodiments. Alternatively, dummy fins (dielectric fins, not shown) may be formed to protrude higher than the top surfaces of STI regions 22, and the etching may be stopped on the top surfaces of the dummy fins. The openings are then filled with a dielectric material(s) to form gate isolation regions 54, as shown in FIGS. 7A, 7B and 7C as an example. In accordance with alternative embodiments, the gate spacers 38, ILD 48, and CESL 46 exposed to the openings are also etched, and the resulting gate isolation region 54 may cut two or more dummy gate stacks 30.

FIGS. 8A, 8B, 8C, and 9-11 illustrate the formation of a fin isolation region, so that neighboring source/drain regions 42 may be electrically de-coupled from each other when needed. Otherwise, all of the source/drain regions 42 that are formed based on the same protruding semiconductor fin 24' will be electrically connected.

Figure 8A:
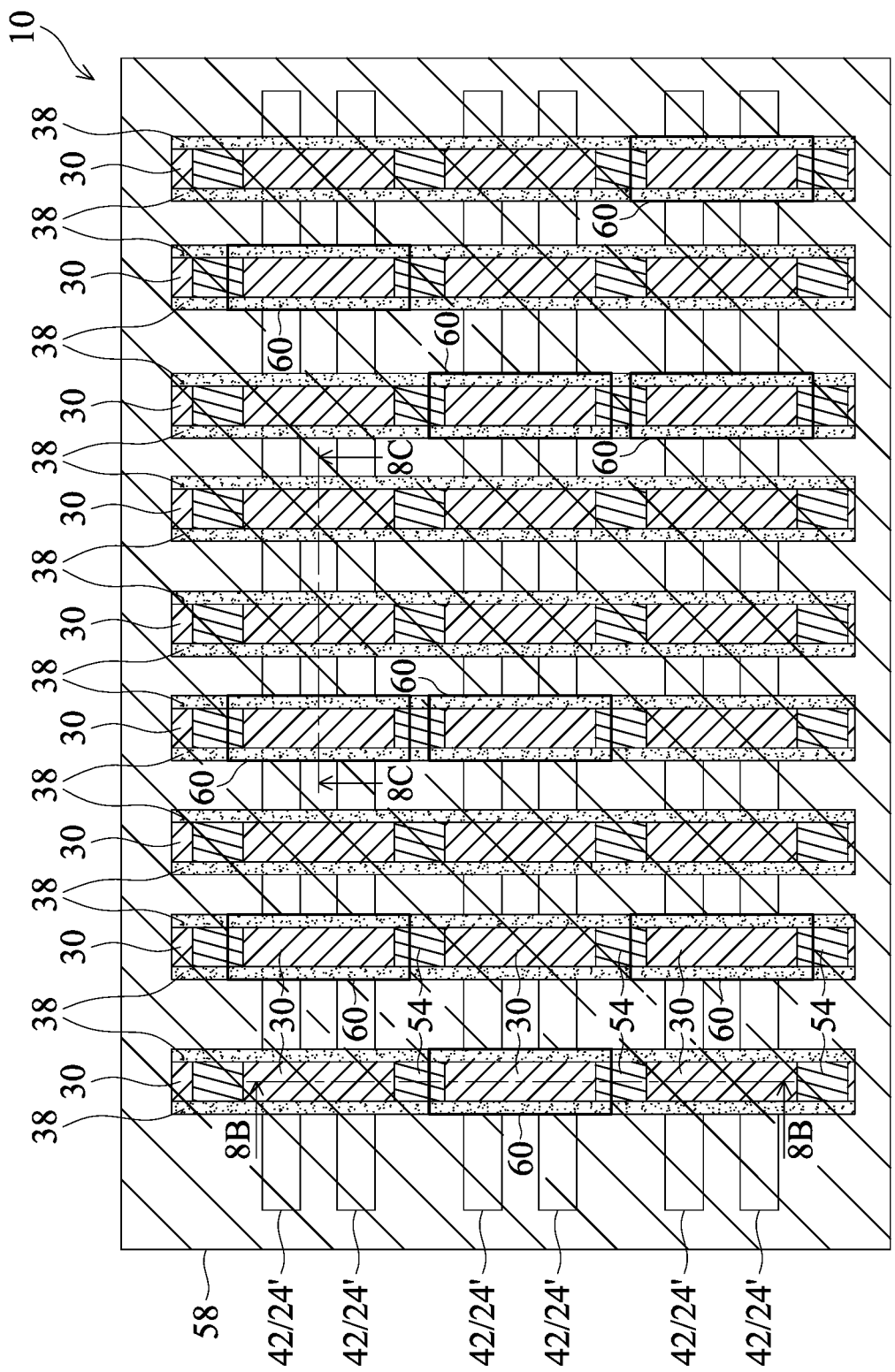
Figure 8B:
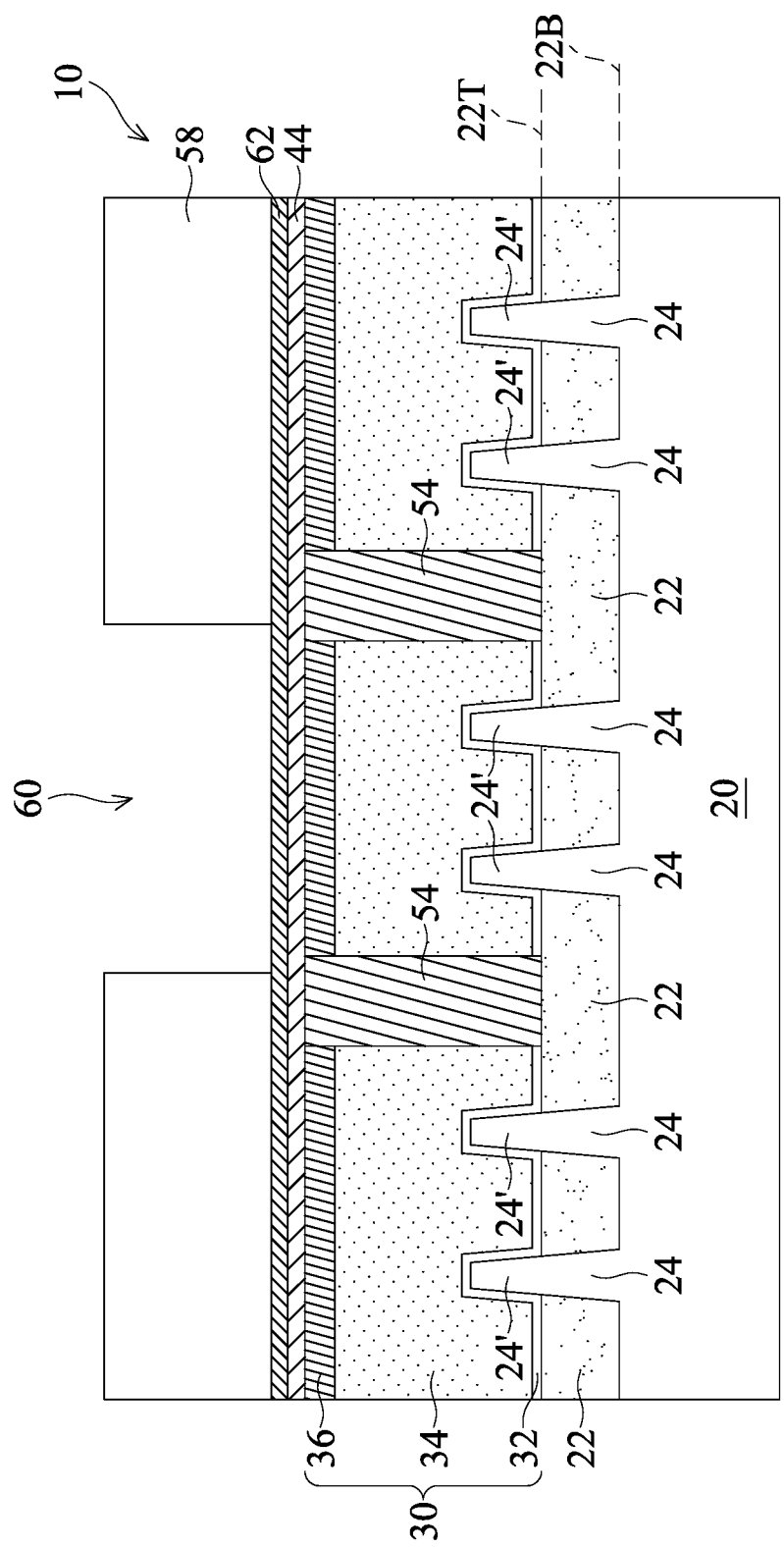
Figure 8C:
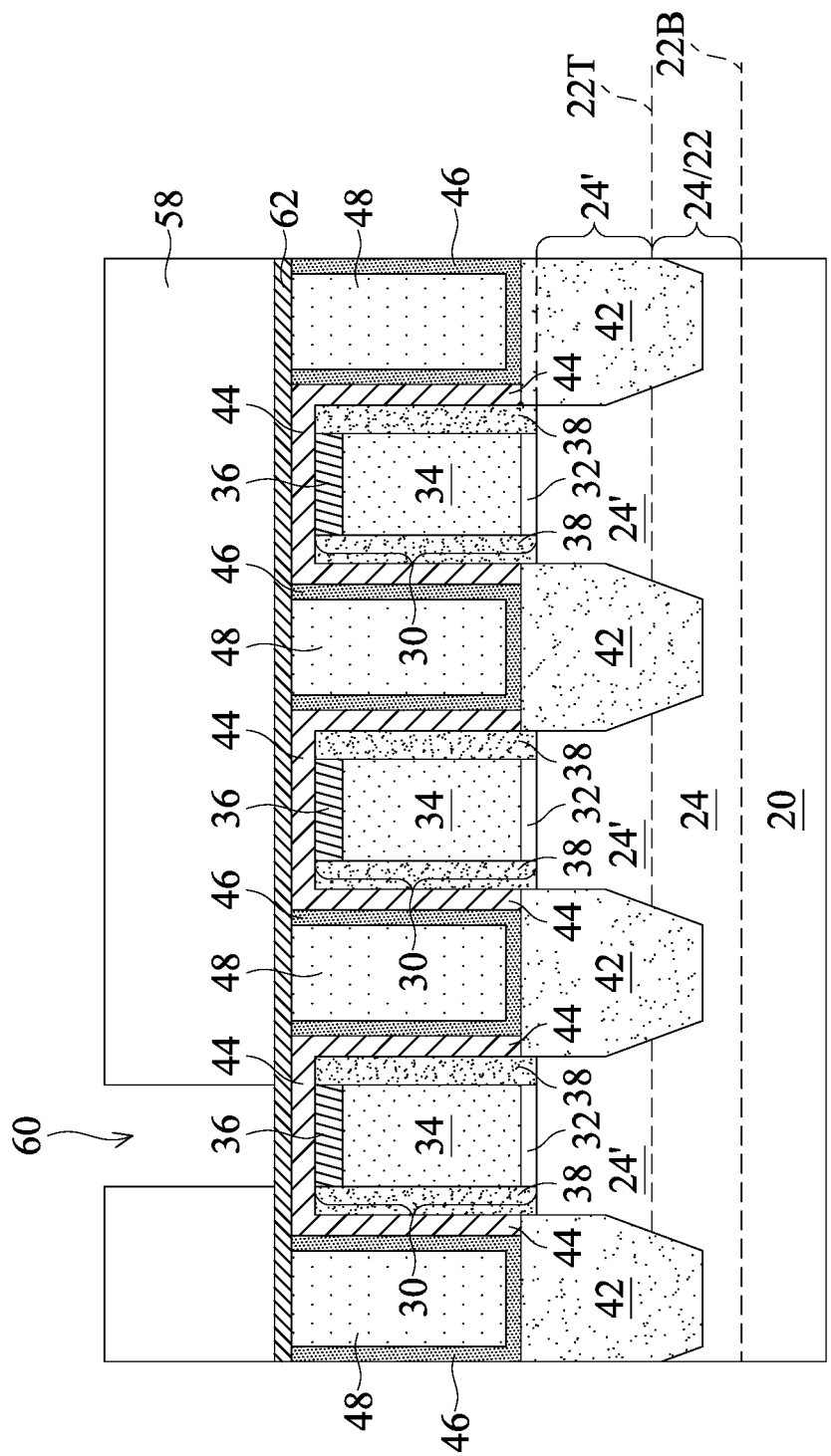

Referring to FIG. 8A, which is a top view, photo resist 58 is formed to cover wafer 10, followed by patterning photo resist 58 to form openings 60. The respective process is illustrated as process 212 in the process flow 200 as shown in FIG. 22. Each of openings 60 overlaps at least one, and possibly more, protruding fins 24'. Some edge portions of gate isolation regions 54 may also be exposed through openings 60 to provide some process margin. FIG. 8B illustrates the cross-section 8B-8B of the structure shown in FIG. 8A. FIG. 8C illustrates the cross-section 8C-8C of the structure shown in FIG. 8A.

FIGS. 8B and 8C further illustrate the formation of CMP stop layer (protection layer) 62 in accordance with some embodiments, which is formed before the formation of photo resist 58. In accordance with some embodiments, CMP stop layer 62 is formed of or comprises silicon nitride, silicon oxynitride, silicon carbo-nitride, or the like. In accordance with alternative embodiments, the process for forming CMP stop layer 62 is skipped. In FIG. 8C and subsequent figures, the levels of top surface 22T and bottom surfaces 22B of STI regions 22 may be illustrated to show where STI regions 22 are, although STI regions 22 are not in the illustrated cross-sections.

Figure 9:
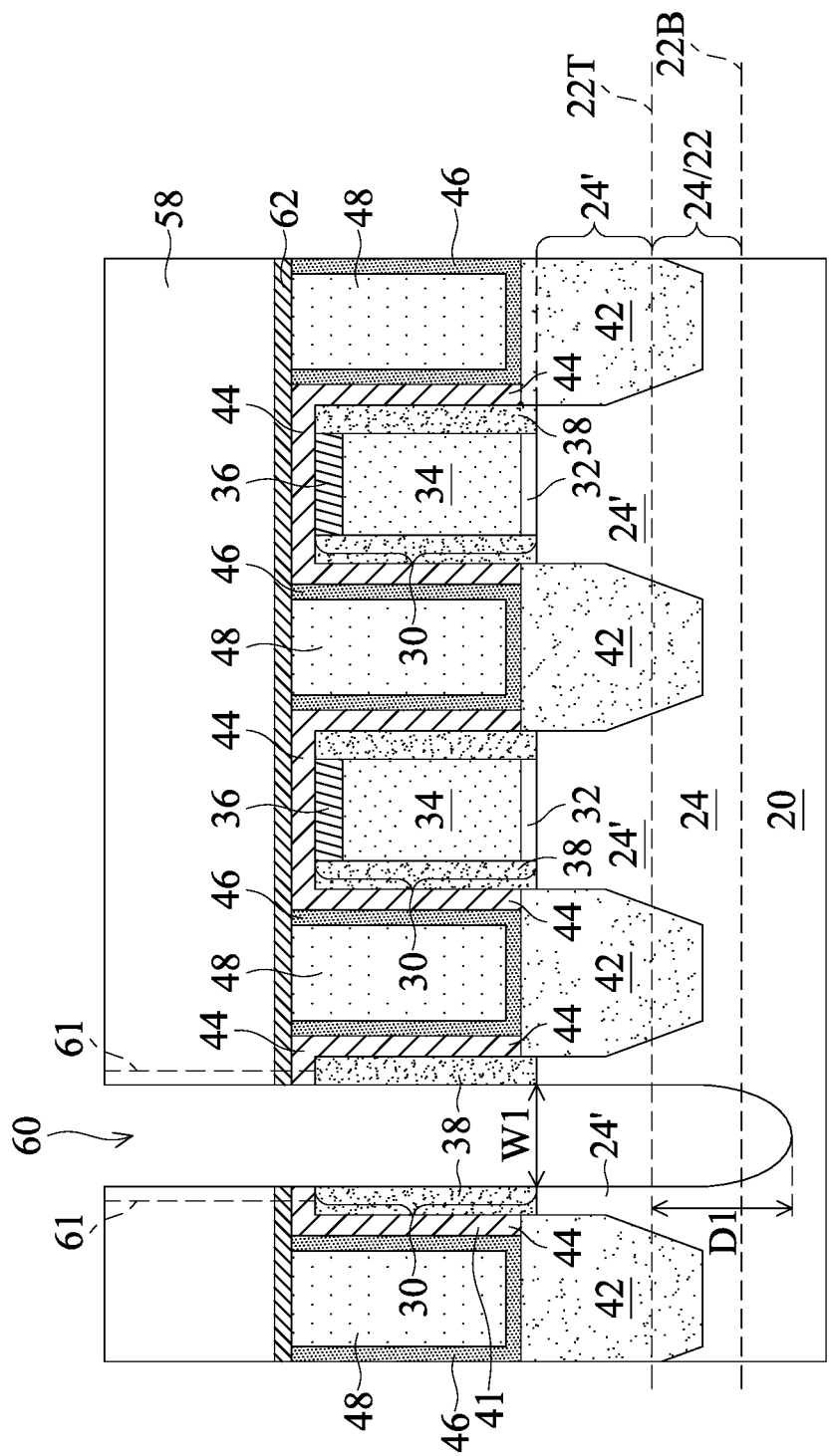

The photo resist 58 as shown in FIG. 8B is then used as an etching mask to etch the underlying CMP stop layer 62, protection layer 44, hard mask 36, dummy gate electrode 34, and dummy gate dielectric 32. The respective process is illustrated as process 214 in the process flow 200 as shown in FIG. 22. Trench 60 thus extends vertically down between opposing gate spacers 38. The resulting opening is also referred to as trench 60. As a result, the structure shown in FIG. 9 is formed. Next, the exposed portion of protruding fin 24' is etched. The respective process is illustrated as process 216 in the process flow 200 as shown in FIG. 22. After the exposed portion of protruding fin 24' is etched, the underlying semiconductor strip 24, which is between opposite portions of STI regions 22, is also etched. It is appreciated that while the position of the STI regions 22 are marked in FIG. 9, STI regions 22 are actually in a different plane than illustrated, and include portions in front of and behind the illustrated plane. Trench 60 may extend lower than STI regions 22, and may extend into the bulk portion of substrate 20 lower than STI regions 22.

In accordance with some embodiments, the etching is performed using gate spacers 38 to define the boundaries of trench 60. Accordingly, by forming vertical gate spacers 38, the side edges of trench 60 are vertical. In accordance with some embodiments, at least the upper part, which upper part includes the portion of trench 60 higher than the bottoms of STI regions 22, is vertical and straight. The bottom portion of trench 60 may be rounded. The top portions of trench 60 may also be wider than the bottom portions. For example, dashed lines 61 are used to represent the respective boundaries of the trench 60.

In accordance with some embodiments, trench 60 has width W1 in the range between about 20 nm and about 30 nm, wherein width W1 may be measured at the bottom end of dummy gate stacks 30. Furthermore, trench 60 may extend lower than the bottom of protruding fins 24', for example, by depth D1, which may be in the range between about 50 nm and about 200 nm. Trench 60 may also extend lower than the bottoms of source/drain regions 42.

Figure 10:
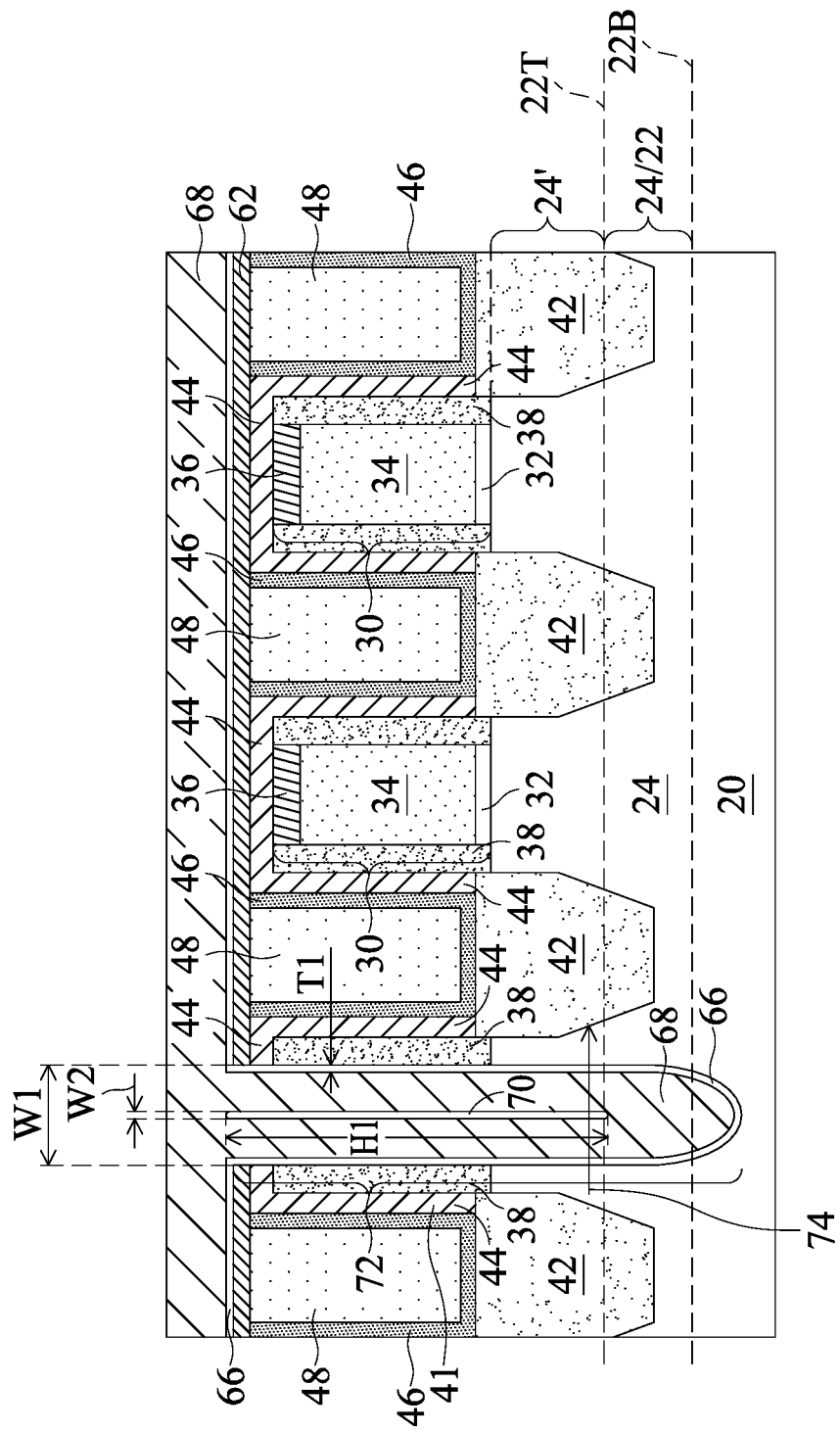

FIG. 10 illustrates the deposition of dielectric layer 66 (a liner dielectric layer) and dielectric layer 68 to fill trench 60. The respective process is illustrated as process 218 in the process flow 200 as shown in FIG. 22. The materials of dielectric layer 66 and dielectric layer 68 are different from each other. In accordance with some embodiments, dielectric layer 66 has good leakage (current) prevention ability. On the other hand, the material of dielectric layer 68 is selected to have better etching resistance to the etching chemical used in the subsequent etching process, for example, for forming contacting openings. For example, in the subsequent etching process, dielectric layer 68 has better etching resistance (lower etching rate) than dielectric layer 66. The etching chemical may include carbon-and-fluorine based gases such as $CF_4$, $CHF_3$, $CH_2F_2$, or the like, or combinations thereof. An example material of dielectric layer 66 is or comprises silicon oxide ($SiO_2$), and an example material of dielectric layer 68 is or comprises silicon nitride ($Si_3N_4$), silicon oxynitride, silicon oxycarbonitride, or the like. Other materials may also be used. The portions of dielectric layer 66 and dielectric layer 68 in trench 60 are collectively referred to as fin isolation region 72.

The deposition of dielectric layer 66 and dielectric layer 68 may include conformal deposition processes such as ALD (Plasma Enhance ALD (PEALD) or thermal ALD), CVD, or the like, so that the resulting dielectric layer 66 and dielectric layer 68 are conformal layers. For example, the thickness variation of different parts of dielectric layer 66 and dielectric layer 68 may be smaller than about 10 percent. In accordance with some embodiments, the deposition of dielectric layer 66 is performed at a temperature in a range between about 200° C. and about 300° C. The thickness T1 of the dielectric layer 66 may be in the range between about 1/5 and about 2/5 of width W1 of trench 60. For example, thickness T1 is in the range between about 2 nm and about 8 nm. Thickness T1 may also be measured at the bottom level of dummy gate stacks 30.

In accordance with some embodiments in which dielectric layer 68 comprises silicon nitride, dielectric layer 68 is deposited using precursors including dichlorosilane ($SiH_2Cl_2$) and ammonia ($NH_3$). Hydrogen ($H_2$) may also be added. The deposition process may be performed using ALD, CVD, or the like. In accordance with some embodiments, the deposition is performed at a low temperature, for example, lower than about 400° C., and may be in the range between about 300° C. and about 400° C.

In addition, dielectric layer 68 may be deposited using a different deposition method than dielectric layer 66. For example, dielectric layer 66 may be deposited using CVD, while dielectric layer 68 may be deposited using ALD.

In accordance with some embodiments, the formation of dielectric layer 68 is performed through a uniform process, so that the entire dielectric layer 68 has uniform properties such as hardness, density, and the like. In accordance with alternative embodiments, the formation of dielectric layer 68 includes two processes performed using different process conditions. For example, a lower portion of dielectric layer 68 may have a higher density and a greater hardness than a corresponding upper portion of dielectric layer 68. When adjusting from the formation of the lower portion to the higher portion of dielectric layer 68, wafer temperature and deposition chamber pressure may be lowered. For example, a low temperature in the range between about 450° C. and about 500° C. and a low pressure lower than about 0.1 torr may be used for depositing dielectric layer 68.

Figure 19:
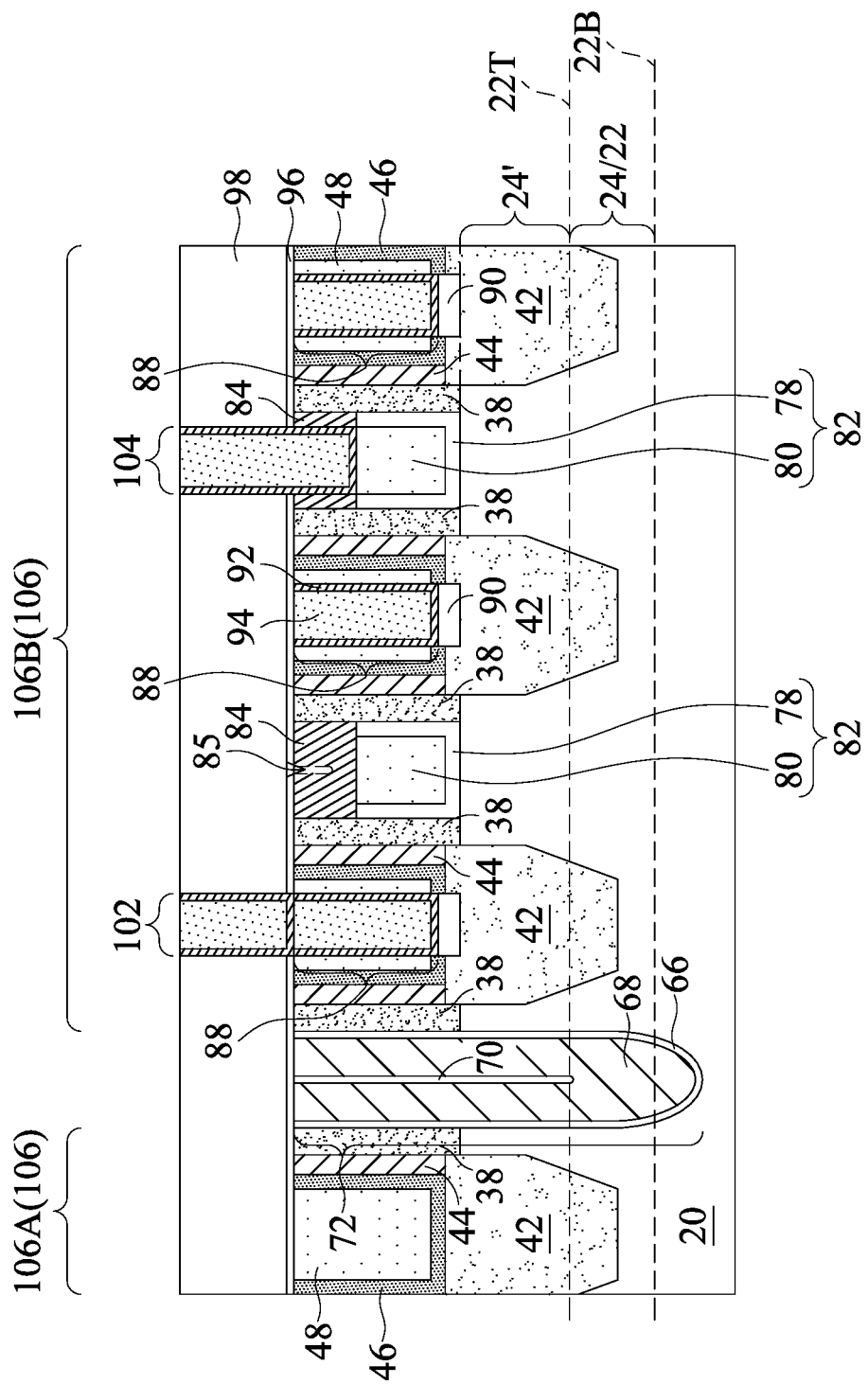

In accordance with some embodiments, the process conditions for depositing dielectric layer 68 are selected and adjusted, so that seam 70 is formed and has a great height H1. It is desirable that seam 70 is also narrow. Seam 70 acts as an effective barrier for the leakage current of the conductive features on the opposite sides of fin isolation region 72. For example, the conductive features include source/drain regions 42 and source/drain contact plugs 88 as shown in FIG. 19. The reduction of the leakage current is more effective when seam 70 is high, and extends deep downwardly.

In accordance with some embodiments, the top end of seam 70 is higher than the top surfaces of gate stacks 30. The bottom end of seam 70 may be at any level lower than the top surface of protruding fin 24'. For example, the bottom end of seam 70 may be at a level lower than the top surface and higher than the bottom end of protruding fin 24'. The bottom end of seam 70 may also be lower than the bottom end of protruding fin 24'. The bottom end of seam 70 may also be at a level lower than the bottom end of protruding fin 24' and higher than the bottom ends of source/drain regions 42, or at a level lower than the bottom ends of source/drain regions 42. Making the bottom end of seam 70 to be lower than the bottom ends of source/drain regions 42 may effectively cut the direct path between source/drain regions 42. For example, the direct path 74 (drawn at the bottom end of seam 70) and the direct paths higher than path 74 are effectively cut, and the leakage current is effectively reduced.

Also, seam 70 has a low dielectric constant (k value) equal to 1.0, and hence the conductive features on the opposite sides of fin isolation region 72 may have smaller parasitic capacitance.

While seam 70 has a great height to reduce leakage current and parasitic capacitance, the width W2 of seam 70 is kept small. Otherwise, seam 70 may be adversely widened in subsequent processes, and conductive materials may be undesirable filled into seam 70 to cause electrical shorting. The width W2 of seam 70 cannot be too small. Otherwise, the leakage-prevention ability and the reduction in parasitic capacitance are compromised. In accordance with some embodiments, width W2 is in the range between about 0.5 nm and about 1 nm. Width W2 may also be measured at the bottom level of dummy gate stacks 30. The widths of seam 70 may be substantially uniform except the top and the bottom portions of seam 70. For example, more than about 90 percent of the seam 70 may have a uniform width equal to width W2.

In order to make seam 70 being both narrow and high, gate spacers 38 are formed to be vertical and straight. Also, conformal deposition processes such as ALD and CVD are used. In addition, the formation process conditions of seam 70 are adjusted. For example, the temperature of wafer 10 during the formation of dielectric layer 68 may be reduced (and may be minimized) to reduce the width W2 of seam 70. On the other hand, the temperature of wafer 10 cannot be too low either. Otherwise, dielectric layer 68 may not be able to be successfully deposited. In accordance with some embodiments in which dielectric layer 68 comprises silicon nitride, the deposition temperature may be in the range between about 300° C. and about 400° C., and when temperature is lower than 300° C., dielectric layer 68 may not be able to be deposited. The narrowing of seam 70 may also be achieved by reducing the pressure in the respective deposition chamber for depositing dielectric layer 68. For example, the pressure of the formation (ALD or CVD) chamber may be reduced to lower than about 1 Torr. Reducing at least one or both of temperature and pressure may reduce molecular collision, and hence seam 70 may be narrowed.

Figure 11:
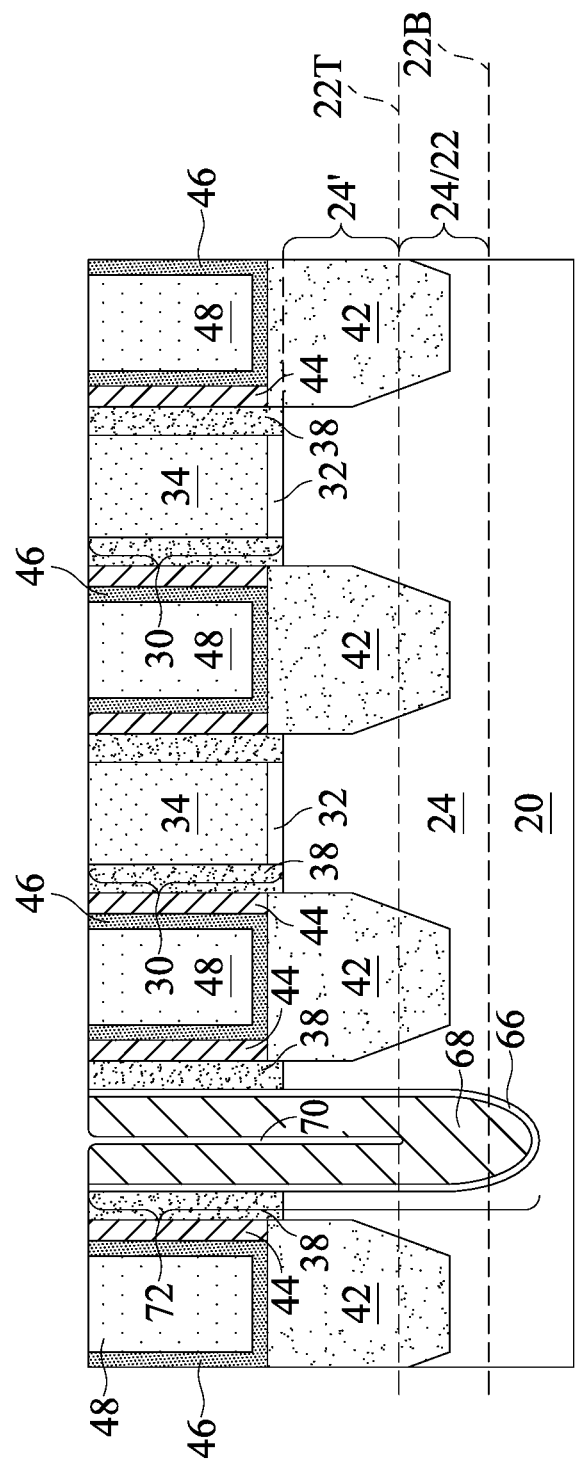

Referring to FIG. 11, after the deposition process, a planarization process such as a CMP process or a mechanical grinding process may be performed to level the top surface of dielectric layer 66 and dielectric layer 68. The planarization process may include several planarization processes, until the planarization stops on dummy gates 34. For example, CMP stop layer 62 may be used as the first CMP stop layer, and then the CMP is continued using hard masks 36 or dummy gate electrodes 34 as a second CMP stop layer. Fin isolation region 72 is thus formed. In accordance with some embodiments, at this time, seam 70 extends to the top of the resulting fin isolation region 72. In accordance with alternative embodiments, at this time, the top end of seam 70 is lower than the top surface of fin isolation region 72, and the entire seam 70 is embedded inside fin isolation region 72.

In accordance with some embodiments, the top surfaces of dielectric layers 66 and 68 may be at different levels. For example, the top surfaces of dielectric layer 66 may be higher than or lower than the top surface of dielectric layer 68.

Figure 12:
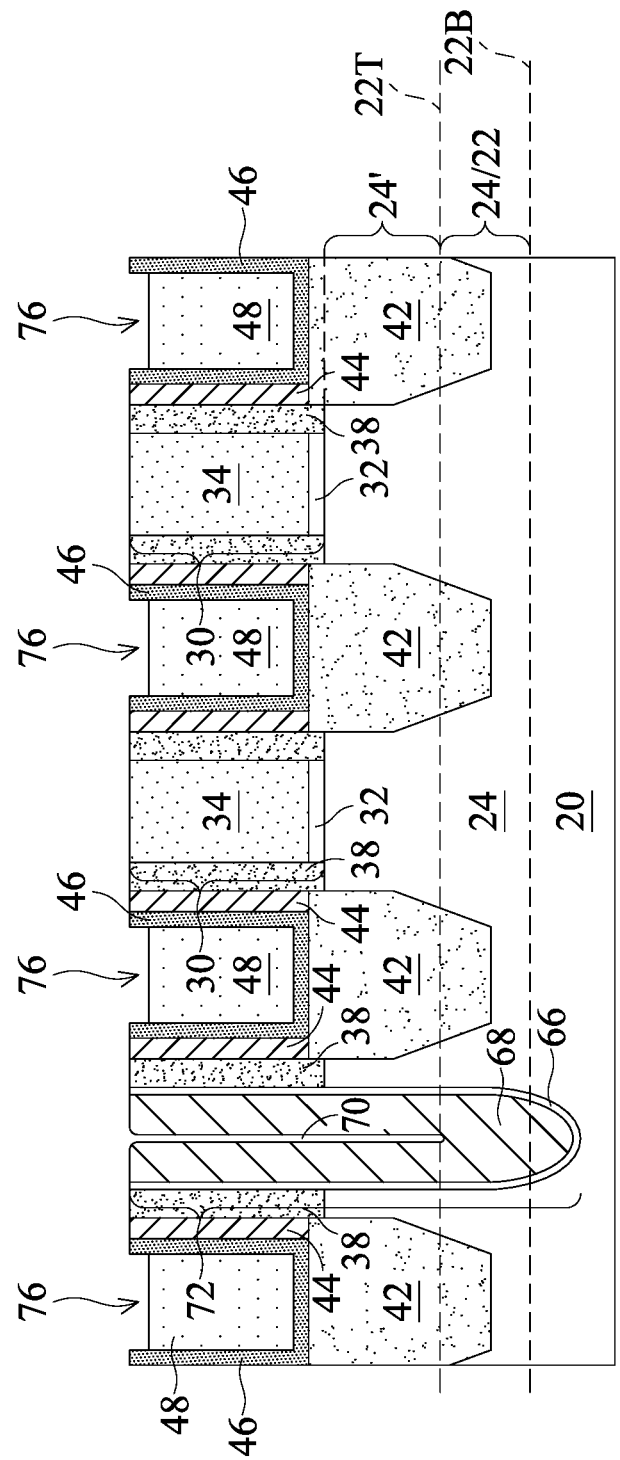
Figure 13:
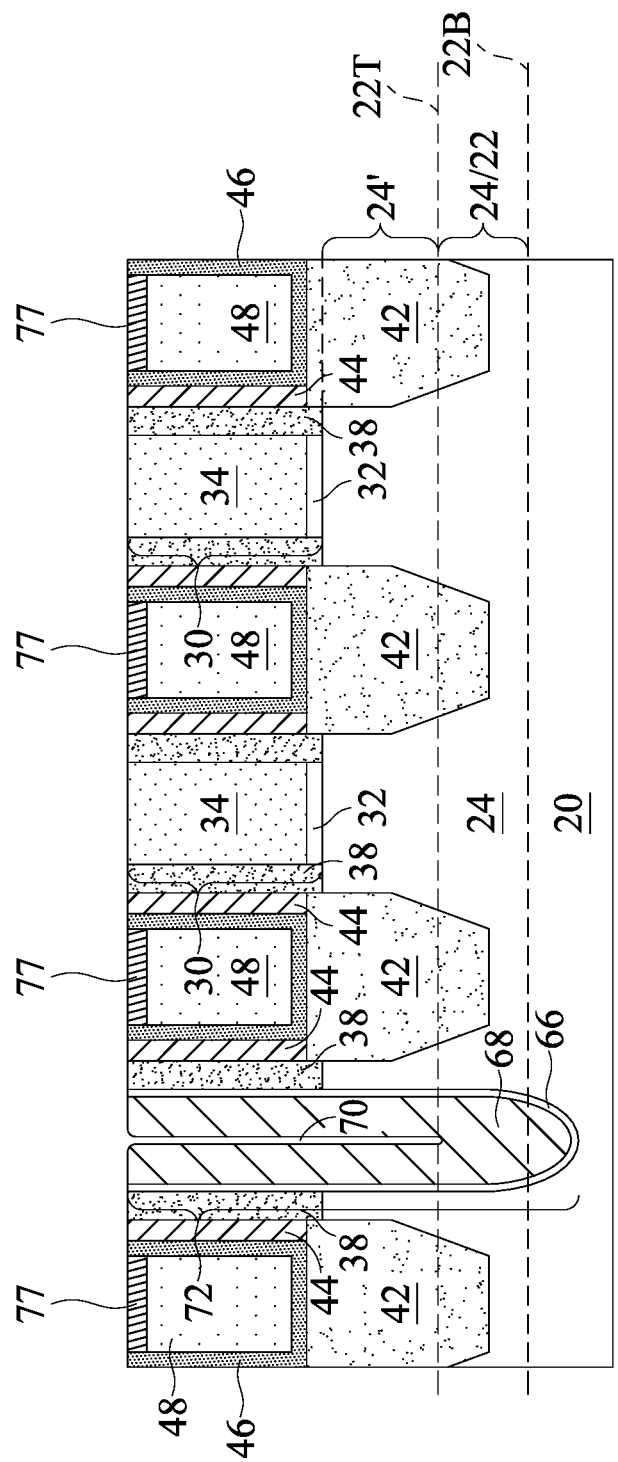

FIG. 12 illustrates the recessing of ILD 48, so that recesses 76 are formed. CESL 46 may be, or may not be recessed. Next, as shown in FIG. 13, protection layers 77 are formed to fill recesses 76. The formation process may include depositing a material (which may be a dielectric material) to fill recesses 76, and then performing a planarization process such as a CMP process or a mechanical grinding process, so that the excess portions of the dielectric material outside of recesses 76 are removed. Protection layers 77 may be formed of or comprises silicon nitride, silicon oxynitride, silicon carbo-nitride, or the like.

Figure 14:
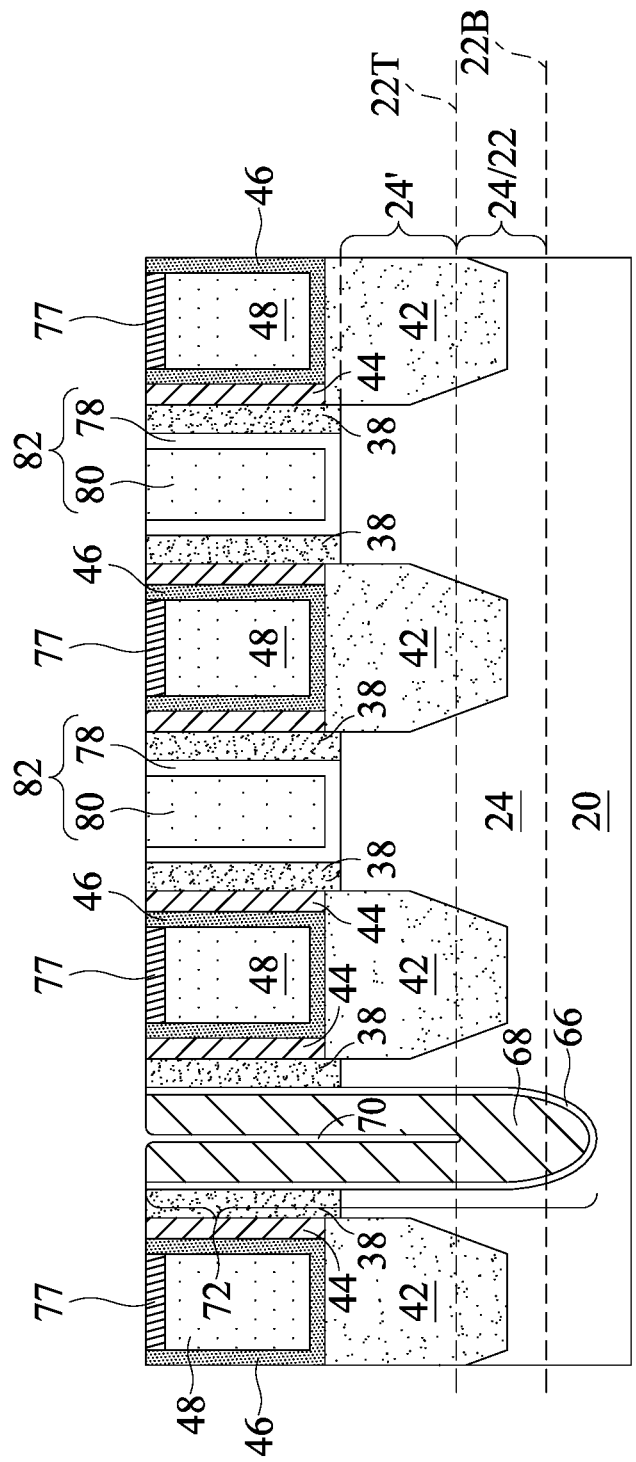

FIG. 14 illustrates the formation of replacement gate stacks 82. The respective process is illustrated as process 220 in the process flow 200 as shown in FIG. 22. The dummy gate stacks 30 as shown in FIG. 13 are removed through etching, and trenches are formed. Next, (replacement) gate stacks 82 are formed, which include gate dielectrics 78 and gate electrodes 80. The formation of gate stacks 82 includes forming/depositing a plurality of layers, and then performing a planarization process such as a CMP process or a mechanical grinding process. Protection layers 77 may also be removed by the planarization process, or may be removed in a subsequent process.

In accordance with some embodiments of the present disclosure, each of gate dielectrics 78 includes an Interfacial Layer (IL) as its lower part. The IL is formed on the exposed surfaces of protruding fins 24'. The IL may include an oxide layer such as a silicon oxide layer, which is formed through the thermal oxidation of protruding fins 24', a chemical oxidation process, or a deposition process. Each of gate dielectrics 78 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of protruding fins 24' and the sidewalls of gate spacers 38. In accordance with some embodiments of the present disclosure, the high-k dielectric layers in gate dielectrics 78 are formed using ALD, CVD, or the like.

Gate electrodes 80 are formed on top of gate dielectrics 78, and fill the remaining portions of the trenches left by the removed dummy gate stacks. The sub-layers in gate electrodes 80 are not shown separately, while the sub-layers may be distinguishable from each other due to the difference in their compositions. The deposition of at least lower sub-layers may be performed using conformal deposition methods such as ALD or CVD.

The sub-layers in gate electrodes 80 may include, and are not limited to, a Titanium Silicon Nitride (TiSiN) layer, a tantalum nitride (TaN) layer, a titanium nitride (TiN) layer, a titanium aluminum (TiAl) layer, an additional TiN and/or TaN layer, and may include a filling metal region. Gate electrodes 80 are referred to as metal gates hereinafter. Some of these sub-layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include tungsten, cobalt, or the like.

Figure 15:
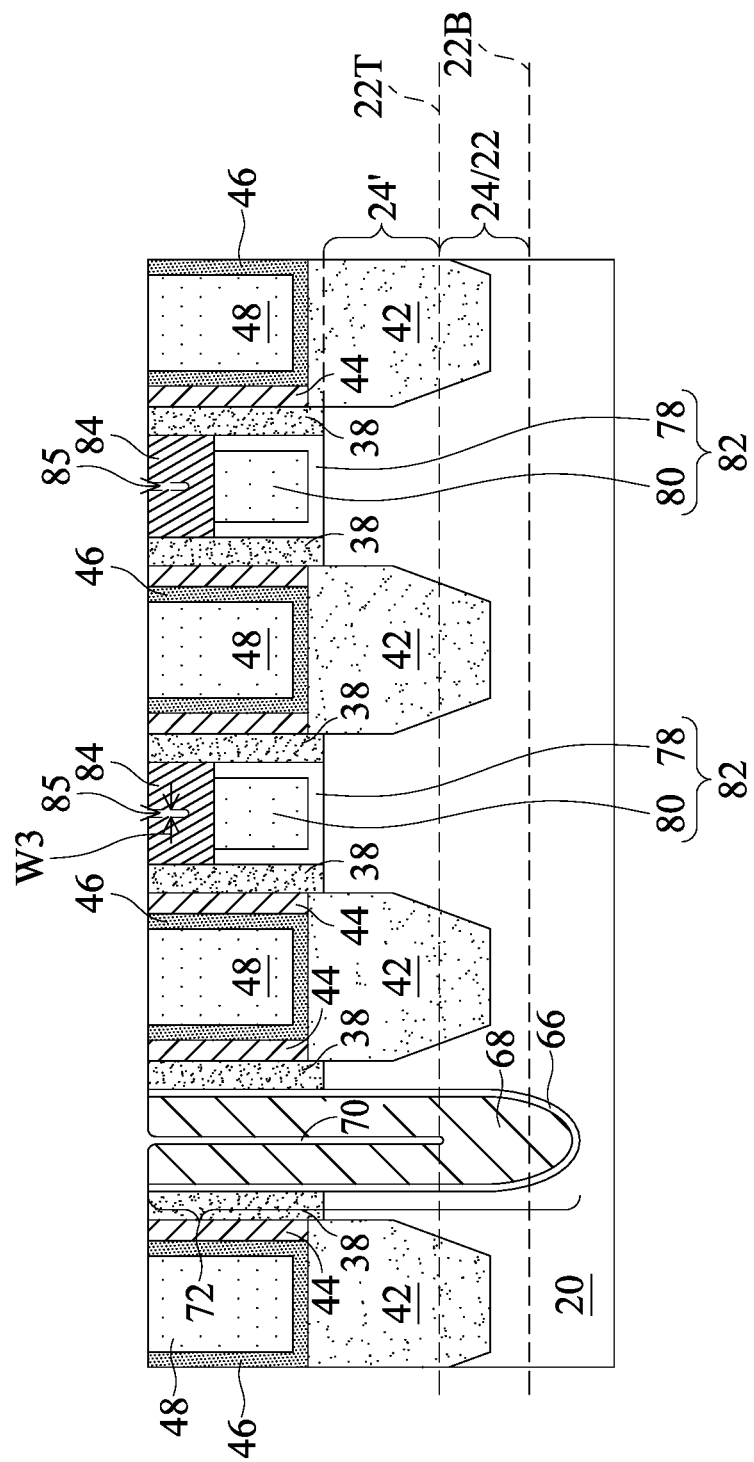

FIG. 15 illustrates the formation of dielectric hard masks 84, which are sometimes referred to as Self-Aligned Contact (SAC) masks 84. The respective process is illustrated as process 222 in the process flow 200 as shown in FIG. 22. The formation process may include recessing replacement gate stacks 82, for example, through etching processes, filling a dielectric material, and performing a planarization process to remove excess portions of the dielectric material. SAC masks 84 may be formed of or comprise SiN, $SiO_2$, SiOC, SiOCN, or the like, or combinations thereof. Protection layers 77, if not removed in the preceding processes, may also be removed by the planarization process.

In accordance with some embodiments, SAC masks 84 may have seams 85 formed therein. The formation process details of seams 85 may be similar to the formation of seam 70, and hence are not repeated herein. The top width W3 of seams 85 are formed as being small, while seams 85 may be as high as possible. In accordance with some embodiments, top width W3 is smaller than about 1 nm, so that seams 85 are not expanded in subsequent processes. Top width W3 may be in the range between about 0.5 nm and about 1 nm, so that the parasitic capacitance between neighboring contact plugs on the opposite sides of SAC masks 84 may be reduced, and leakage current may be reduced also. The widths of different portions of seam 85 may be substantially uniform except the bottom end of seam 85. For example, more than about 90 percent of the seam 85 may have a uniform width equal to width W3. In accordance with alternative embodiments, seam 70 is formed, while seam 85 is not formed, and seam 85 is shown as being dashed to indicate it may or may not be formed.

In the processes as shown in FIGS. 12 through 15 as discussed, fin isolation regions 72 are shortened, resulting in the reduction in the height of seam 70. At a time after SAC masks 84 are formed, the remaining seam 70 is still thin and high. For example, at a time after the SAC masks 84 are formed, a height-to-width ratio of the seam 70 is greater than about 10, and may be in the range between about 10 and about 20, or greater than about 20. The remaining height may be greater than about 10 nm, and may be in the range between about 10 nm and about 20 nm. The widths of most parts of seam 70 (including top and middle parts) may be substantially uniform except the bottom end of seam 70. For example, more than about 90 percent of the seam 70 may have a uniform width equal to width W2.

Figure 16:
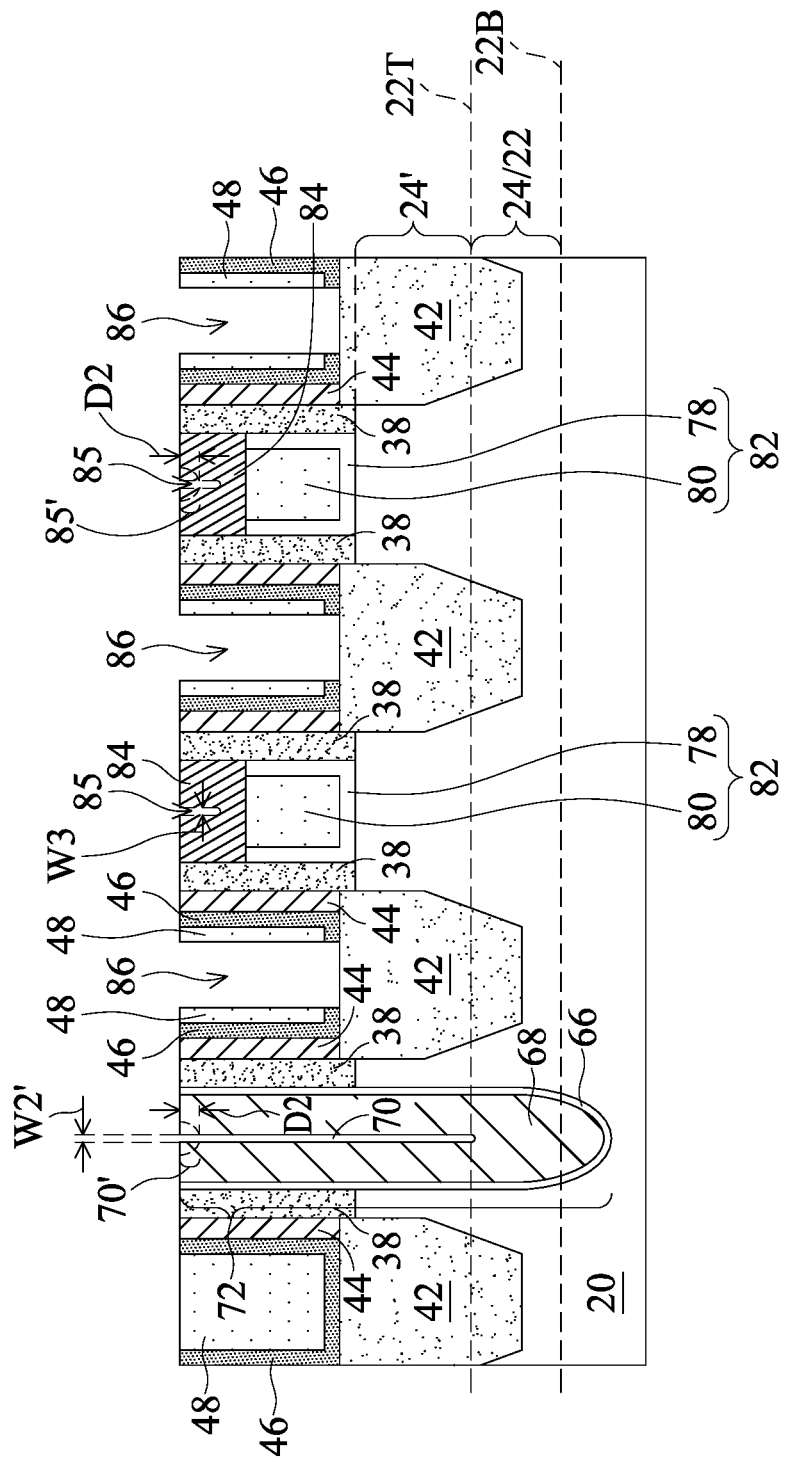

Referring to FIG. 16, some parts of ILD 48 and CESL 46 are etched to form contact openings 86. Some portions of source/drain regions 42 are thus exposed to contact openings 86. The respective process is illustrated as process 224 in the process flow 200 as shown in FIG. 22. In accordance with some embodiments, as shown in FIG. 16, in the illustrated cross-section, there are some portions of CESL 46 and ILD 48 left on the opposite sides of contact openings 86, so that contact openings 86 are separated from gate spacers 38. In accordance with alternative embodiments, in the illustrated cross-section, no CESL 46 and ILD 48 are left on the opposite sides of contact openings 86, and the sidewalls of gate spacers 38 are exposed to the corresponding contact openings 86. The etching may be performed using a fluorine-containing gas such as $C_2F_6$, $CHF_3$, $CH_2F_2$, $C_4F_8$, or the like, or combinations thereof.

Figure 18:
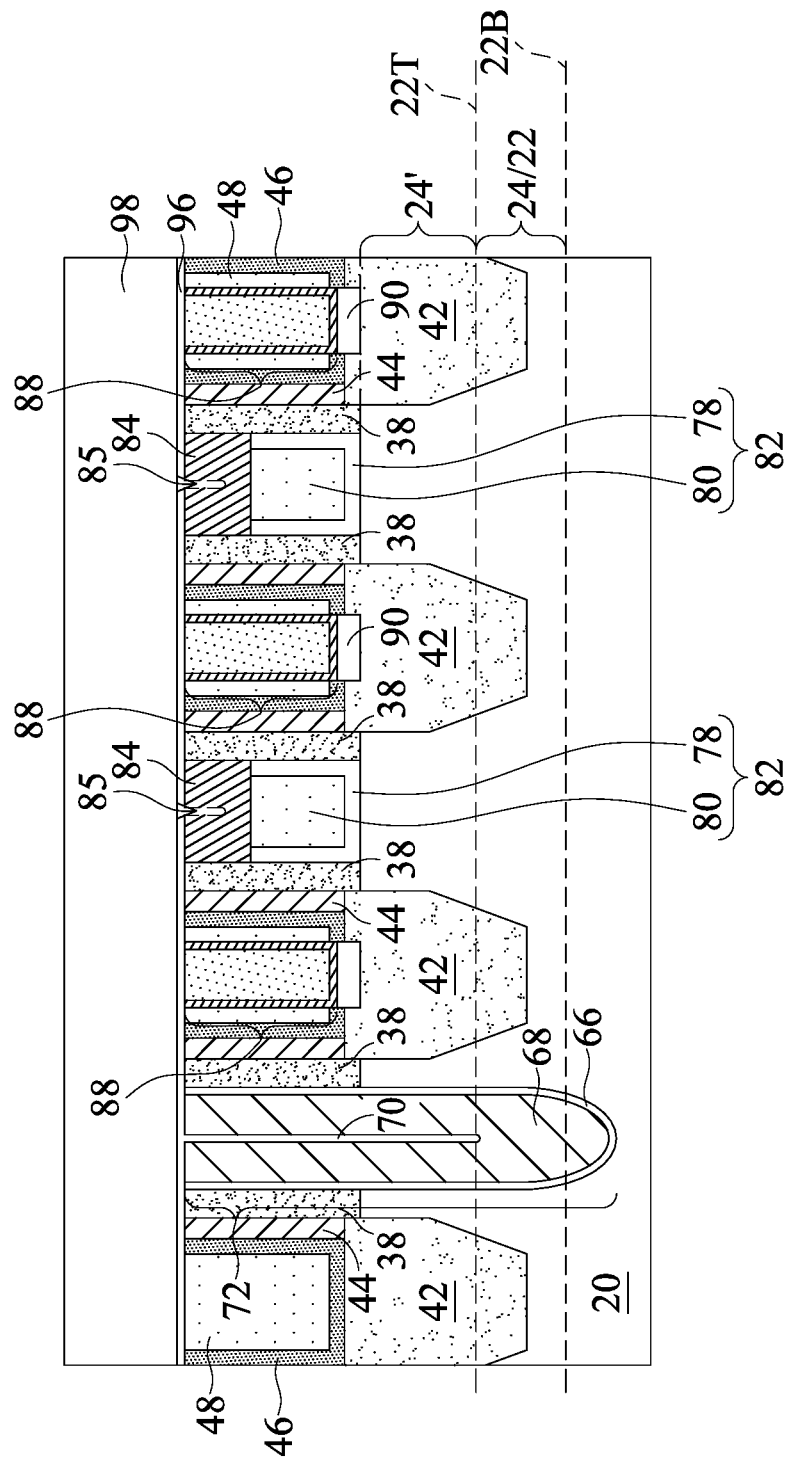

When ILD 48 and CESL 46 are etched, the exposed portions of fin isolation region 72 and SAC masks 84 are also exposed to the etching gas. This may possibly result in the top parts of seams 70 and 85 to be expanded (widened) undesirably. Experimental results have revealed that when the top widths W2' of seam 70 and top width W3 of seams 85 are smaller than about 1 nm, it is difficult for the etching gas to go into seams 70 and 85 in limited etching time, and seams 70 and 85 are not widened. In accordance with alternative embodiments, some small portion of seams 70 and 85 are substantially un-widened, with the top portions slightly widened. The widened portions, however, has small depths and widths. For example, the widened top portions of seams 70 and 85, which are schematically illustrated as 70' and 85', have depths D2 smaller than about 5 nm or smaller than about 2 nm, so that in the subsequent processes, even if conductive materials are filled into the widened top seam portion 70' and 85', the filled conductive materials may be removed in subsequent CMP processes, or may remain in the final structure, for example, remain at a time after the etch stop layer 96 and ILD 98 as shown in FIG. 18 are deposited.

Figure 17:
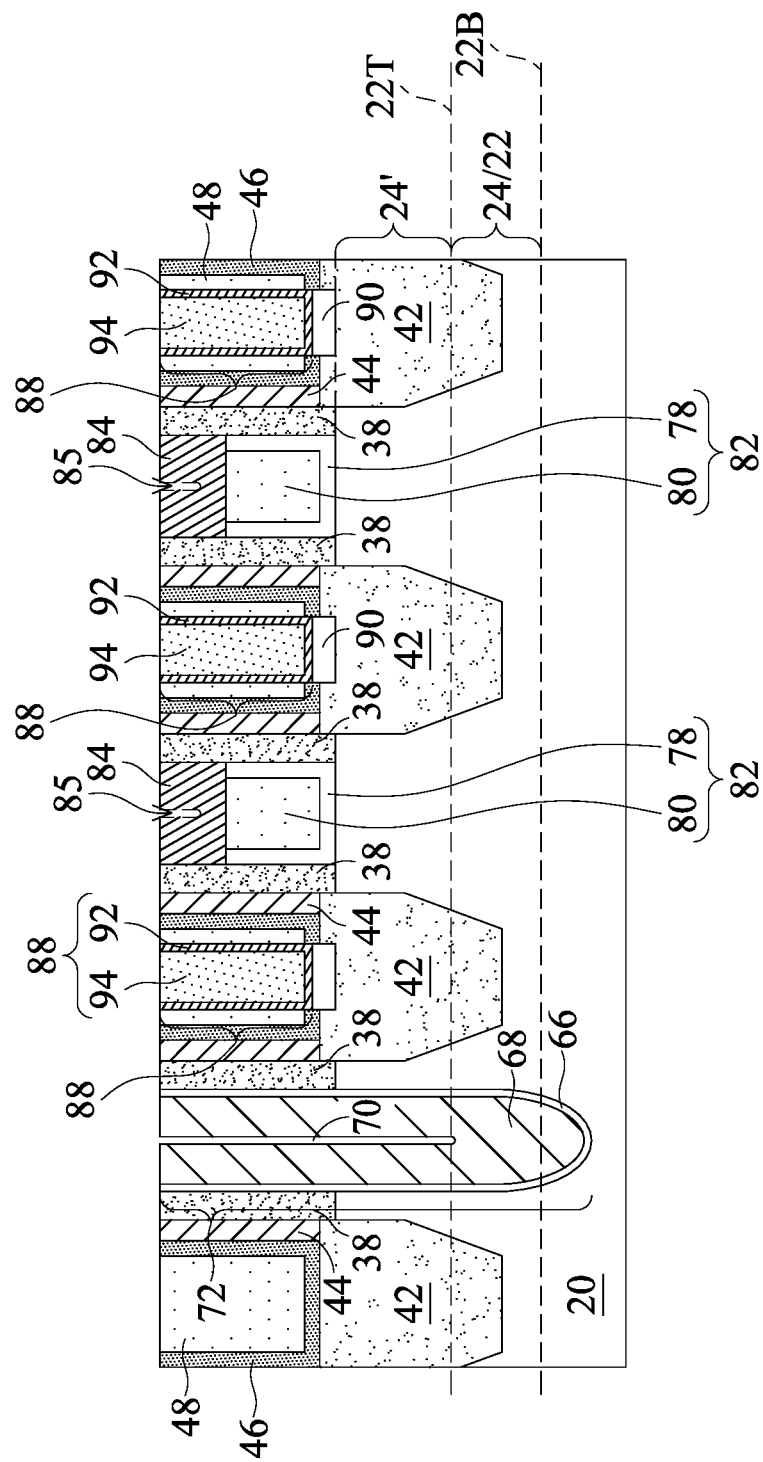

FIG. 17 illustrates the formation of additional features for FinFETs. Source/drain silicide regions 90 and source/drain contact plugs 88 are also formed to electrically connect to source/drain regions 42. The respective process is illustrated as process 226 in the process flow 200 as shown in 22. The formation of source/drain contact plugs 88 may include filling a metal layer into contact openings 86, and depositing a capping layer on the metal layer. The metal layer may include titanium, cobalt, or the like. The capping layer may be formed of or comprises a metal nitride such as titanium nitride.

An annealing process is then performed to react the metal layer with top surface portions of source/drain regions 42, so that source/drain silicide layers 90 are formed. The capping layer and the unreacted portions of the metal layer may be removed, or may be left unremoved. The remaining portion of contact openings 86 are then filled, for example, by a metal nitride layer 92 and a filling metal region 94. The metal nitride layer 92 may be formed of or comprises titanium nitride. The filling metal region 94 may comprise cobalt, tungsten, aluminum, or the like. A planarization process such as a CMP process or a mechanical polishing process is then performed to remove excess material, leaving source/drain contact plugs 88.

The conductive materials (such as titanium, titanium nitride, cobalt, or the like) used in the formation of source/drain contact plugs 88 may not fill into seam 70 and seams 85 when seam 70 and seams 85 are not widened. In accordance with alternative embodiments, the conductive materials are substantially not filled into seam 70 and 85, except some of the widened top and shallow portions of seam portions 70' and seam portion 85' (FIG. 16) may be filled with the conductive materials. The underlying un-widened portions of seam 70 and seams 85, however, are not filled with the conductive materials. The conductive materials filled into the widened seam portions, due to their small depth, may be fully removed by the planarization process in the formation of source/drain contact plugs 88. Alternatively, the conductive materials filled into the widened portions may be partially remaining, and become discontinuous, so that the remaining conductive materials will not electrically short any overlying conductive features.

Referring to FIG. 18, etch stop layer 96 is deposited, followed by the deposition of ILD 98. Etch stop layer 96 may include a metal oxide, a metal nitride, or the like. In accordance with some embodiments, etch stop layer 96 includes an aluminum nitride (AlN) layer, a silicon oxy-carbide layer over the aluminum nitride layer, and an aluminum oxide layer over the silicon oxy-carbide layer. ILD 98 may be formed of a material selected from same group of candidate materials for forming ILD 48.

FIG. 19 illustrates the formation of source/drain contact plug 102 and gate contact plug 104 in accordance with some embodiments. Source/drain contact plug 102 is over and contacting source/drain contact plug 88. Gate contact plug 104 penetrates through SAC mask 84, and contacts gate electrode 80. FinFETs 106A and 106B are thus formed, and are separated by fin isolation region 72.

Figure 20:
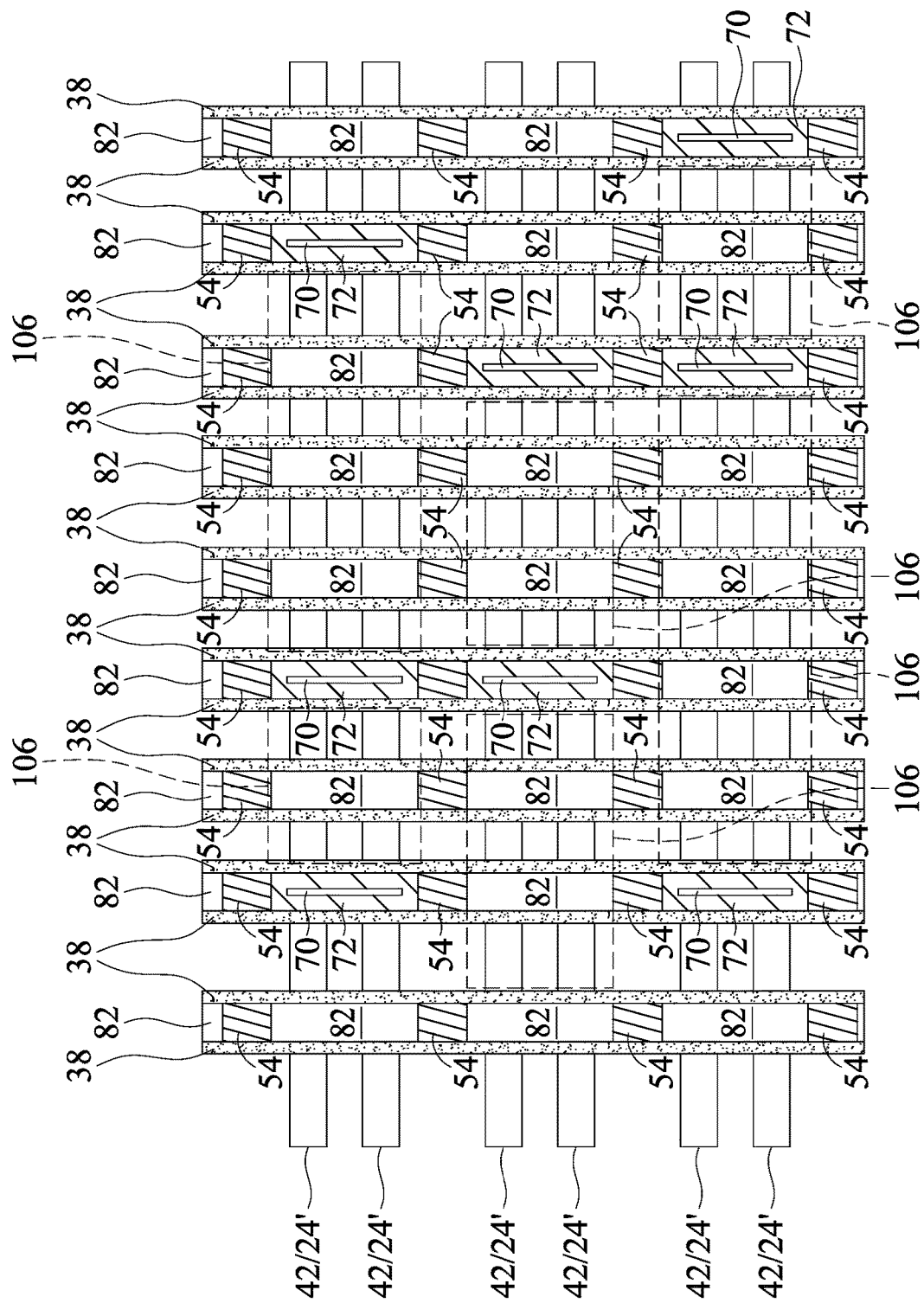

FIG. 20 illustrates a top view of a portion of wafer 10, in which FinFETs are formed, and are separated from each other by gate isolation regions 54 and fin isolation regions 72 as a plurality of FinFETs 106.

Figure 21:
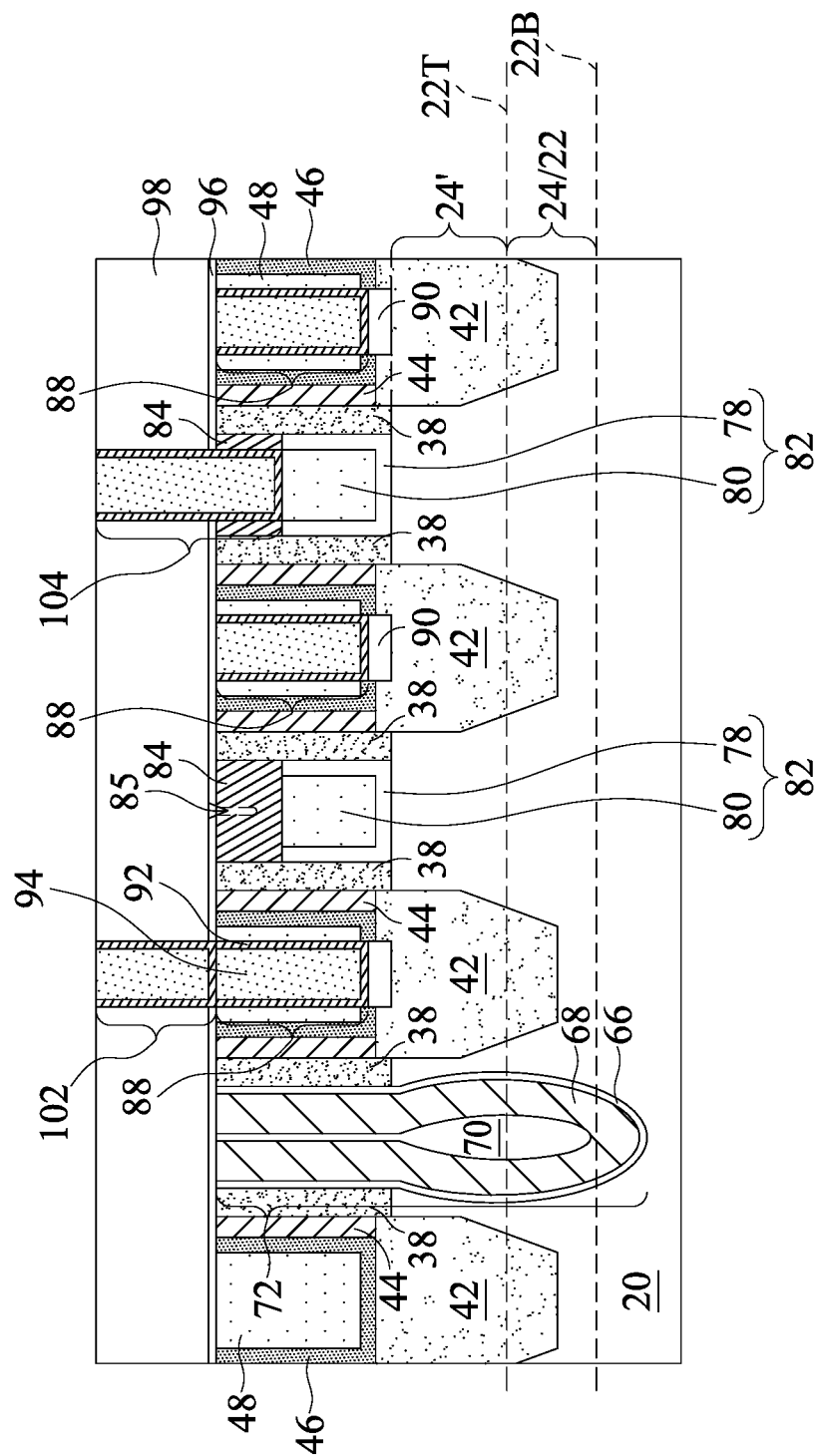
FIG. 21 illustrates a cross-sectional view of FinFETs and an isolation region in accordance with some embodiments.

FIG. 21 illustrates a cross-sectional view of FinFETs and fin isolation region 72 in accordance with alternative embodiments. The structure as shown in FIG. 21 is similar to the structure as shown in FIG. 19, except that the lower part of fin isolation region 72 has expanded width than the top portions. Seam 70 in accordance with some embodiments thus will have its top part (the part higher than the bottom end level of gate spacers 38 and having a uniform width) being narrow, with the top widths smaller than about 1 nm, and may be in the range between about 0.5 nm and about 1 nm. The bottom part of seam 70, however, may have expanded widths. For example, a ratio of the width of a widest part of the lower part of seam 70 to the top widths may be greater than about 5, greater than 10, or greater than 50, for example, in the range between about 5 and about 100.

In accordance with some embodiments, unless specified otherwise, the details (including process details and material details) for forming the structure shown in FIG. 21 may be essentially the same as in the preceding embodiments, and are not repeated herein. The expansion of the low part of the trench filled by fin isolation region 72 may be performed through a two-step process. In a first step in the two-step process, an anisotropic etching process is performed to form the trench 60 as shown in FIG. 9. Next, in a second step in the two-step process, an isotropic etching process is performed to expand the lower part of trench 60. Since the upper part of trench 60 is confined by gate spacers 38, the etching chemical (such as the etching gas or wet etching solution) does not attack gate spacers 38. The lower part of trench 60 is expanded, while the upper part remains not expanded. The anisotropic etching process is performed using dry etching, while the isotropic etching process may be performed using dry etching or wet etching. When the dry etching is used, the etching gas may be the same as or different from the etching gas used in the anisotropic etching process.

The embodiments of the present disclosure have some advantageous features. By adjusting process conditions in the formation of fin isolation region, a narrow and tall seam may be formed. Parasitic capacitance and leakage current may be reduced.

In accordance with some embodiments of the present disclosure, a method includes forming a first dummy gate stack on a protruding semiconductor fin; etching the first dummy gate stack to form a trench; extending the trench downwardly to penetrate through a portion of the protruding semiconductor fin; filling the trench with a dielectric material to form a fin isolation region, wherein a first seam is formed in the fin isolation region, and wherein the first seam extends to a level lower than a top surface level of the protruding semiconductor fin, and wherein the first seam has a top width smaller than about 1 nm; replacing a second dummy gate stack on the protruding semiconductor fin with a replacement gate stack, and forming a source/drain contact plug on a side of the replacement gate stack, wherein the source/drain contact plug comprises conductive materials, and wherein in the forming the source/drain contact plug, the first seam is exposed, and the conductive materials are substantially fully outside of the first seam.

In an embodiment, the first seam further extends to the level lower than a bottom of the protruding semiconductor fin. In an embodiment, the first seam further extends to the level lower than a bottom of a source/drain region that penetrates through the protruding semiconductor fin. In an embodiment, the method further comprises recessing the replacement gate stack to form an additional trench; and filling the additional trench with a dielectric hard mask, wherein at a time after the dielectric hard mask is formed, the first seam has a height-to-width ratio greater than about 10. In an embodiment, the dielectric hard mask further comprises a second seam therein, and wherein at the time, an additional top width of the second seam is smaller than about 1 nm. In an embodiment, the filling the trench comprises depositing a dielectric layer lining the trench, wherein the dielectric material is deposited over the dielectric layer using a conformal deposition process. In an embodiment, the depositing the dielectric material is performed at a temperature in a range between about 300° C. and about 400° C.

In an embodiment, the filling the dielectric material is performed at a pressure lower than about 1 torr. In an embodiment, the method further comprises forming a protection layer on the first dummy gate stack; and before the etching the first dummy gate stack to form the trench, etching-through the protection layer. In an embodiment, the filling the trench comprises an atomic layer deposition process. In an embodiment, the method further comprises, before the etching the first dummy gate stack, depositing a contact etch stop layer and an inter-layer dielectric on a source/drain region on a side of the first dummy gate stack; etching the inter-layer dielectric and the contact etch stop layer to form a contact opening, wherein the source/drain region is exposed through the contact opening, and wherein a top portion of the first seam is exposed to an etching chemical, and is expanded; filling the contact opening with a conductive material, wherein the expanded portion of the first seam is filled with a part of the conductive material; and planarizing the conductive material, wherein the expanded portion of the first seam that is filled with the part of the conductive material is removed.

In accordance with some embodiments of the present disclosure, a method comprises forming dielectric isolation regions in a semiconductor substrate; forming a protruding semiconductor fin protruding higher than the dielectric isolation regions; forming a fin isolation region penetrating through the protruding semiconductor fin, wherein the fin isolation region comprises a seam therein, with the seam extending lower than a top surface of the protruding semiconductor fin, and wherein the forming the fin isolation region comprises depositing a first dielectric layer; and depositing a second dielectric layer over the first dielectric layer, wherein the first dielectric layer and the second dielectric layer are formed of different materials; and forming a first source/drain region and a second source/drain region extending into the protruding semiconductor fin, wherein the first source/drain region and the second source/drain region are on opposite sides of the fin isolation region.

In an embodiment, the method further comprises forming a gate stack on the protruding semiconductor fin, wherein the seam has a seam width measured at a bottom level of the gate stack, and the seam width is smaller than about 1 nm. In an embodiment, the forming the fin isolation region comprises performing an etching process to etch a dummy gate stack and a portion of the semiconductor substrate directly underlying the dummy gate stack to form a trench, and filling the trench with a dielectric material to form the fin isolation region. In an embodiment, the etching process comprises an anisotropic etching process to etch the dummy gate stack and the portion of the semiconductor substrate; and an isotropic etching process to expand a lower portion of the trench. In an embodiment, the seam extends lower than a bottom of the first source/drain region.

In accordance with some embodiments of the present disclosure, a method comprises forming dielectric isolation regions in a semiconductor substrate; forming a protruding semiconductor fin protruding higher than the dielectric isolation regions; forming a first gate spacer and a second gate spacer opposing to each other and over the semiconductor substrate; forming a fin isolation region between, and contacting, the first gate spacer and the second gate spacer, wherein the fin isolation region comprises a seam therein; depositing an etch stop layer over and contacting the dielectric isolation region, wherein the seam remains after the etch stop layer is deposited, and wherein the seam has a height-to-width ratio greater than about 10; and forming a first source/drain region and a second source/drain region extending into the protruding semiconductor fin, wherein the first source/drain region and the second source/drain region are on opposite sides of the fin isolation region.

In an embodiment, the forming the fin isolation region comprises performing an anisotropic etching process to form a trench by removing a dummy gate stack between the first gate spacer and the second gate spacer, and removing a portion of the semiconductor substrate directly underlying the dummy gate stack; and filling the trench with a plurality of dielectric layers. In an embodiment, the forming the fin isolation region further comprises, after the anisotropic etching process, performing an isotropic etching process to expand a lower portion of the trench, wherein the filling the trench comprises performing a conformal deposition process. In an embodiment, the filling the trench with the plurality of dielectric layers is performed through a plurality of conformal deposition processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dummy gate stack on a protruding semiconductor fin;
    etching the first dummy gate stack to form a trench;
    extending the trench downwardly to penetrate through a portion of the protruding semiconductor fin;
    filling the trench with a dielectric material to form a fin isolation region, wherein a first seam is formed in the fin isolation region, and wherein the first seam extends to a level lower than a top surface level of the protruding semiconductor fin;
    replacing a second dummy gate stack on the protruding semiconductor fin with a replacement gate stack; and
    forming a source/drain contact plug on a side of the replacement gate stack, wherein the source/drain contact plug comprises conductive materials, and wherein in the forming the source/drain contact plug, the first seam is exposed, and the conductive materials are substantially fully outside of the first seam.

2. The method of claim 1, wherein the first seam further extends to the level lower than a bottom of the protruding semiconductor fin.

3. The method of claim 1, wherein the first seam further extends to the level lower than a bottom of a source/drain region that penetrates through the protruding semiconductor fin.

4. The method of claim 1 further comprising:
    recessing the replacement gate stack to form an additional trench; and
    filling the additional trench with a dielectric hard mask, wherein at a time after the dielectric hard mask is formed, the first seam has a height-to-width ratio greater than about 10.

5. The method of claim 4, wherein the dielectric hard mask further comprises a second seam therein, and wherein at the time, an additional top width of the second seam is smaller than about 1 nm.

6. The method of claim 1, wherein the filling the trench comprises:
    depositing a dielectric layer lining the trench, wherein the dielectric material is deposited over the dielectric layer using a conformal deposition process.

7. The method of claim 6, wherein the depositing the dielectric material is performed at a temperature in a range between about 300° C. and about 400° C.

8. The method of claim 1, wherein the filling the dielectric material is performed at a pressure lower than about 1 torr.

9. The method of claim 1 further comprising:
    forming a protection layer on the first dummy gate stack; and
    before the etching the first dummy gate stack to form the trench, etching-through the protection layer.

10. The method of claim 1, wherein the filling the trench comprises an atomic layer deposition process.

11. The method of claim 1 further comprising:
    before the etching the first dummy gate stack, depositing a contact etch stop layer and an inter-layer dielectric on a source/drain region on a side of the first dummy gate stack;
    etching the inter-layer dielectric and the contact etch stop layer to form a contact opening, wherein the source/drain region is exposed through the contact opening, and wherein a top portion of the first seam is exposed to an etching chemical, and is substantially not expanded by the etching;
    filling the contact opening with a conductive material; and
    planarizing the conductive material.

12. A method comprising:
    forming dielectric isolation regions in a semiconductor substrate;
    forming a protruding semiconductor fin protruding higher than the dielectric isolation regions;
    forming a fin isolation region penetrating through the protruding semiconductor fin, wherein the fin isolation region comprises a seam therein, with the seam extending lower than a top surface of the protruding semiconductor fin, and wherein the forming the fin isolation region comprises:
       depositing a first dielectric layer; and
       depositing a second dielectric layer over the first dielectric layer, wherein the first dielectric layer and the second dielectric layer are formed of different materials; and
    forming a first source/drain region and a second source/drain region extending into the protruding semiconductor fin, wherein the first source/drain region and the second source/drain region are on opposite sides of the fin isolation region.

13. The method of claim 12 further comprising forming a gate stack on the protruding semiconductor fin, wherein the seam has a seam width measured at a bottom level of the gate stack, and the seam width is smaller than about 1 nm.

14. The method of claim 12, wherein the forming the fin isolation region comprises:
    performing an etching process to etch a dummy gate stack and a portion of the semiconductor substrate directly underling the dummy gate stack to form a trench, and
    filling the trench with a dielectric material to form the fin isolation region.

15. The method of claim 14, wherein the etching process comprises:
    an anisotropic etching process to etch the dummy gate stack and the portion of the semiconductor substrate; and
    an isotropic etching process to expand a lower portion of the trench.

16. The method of claim 12, wherein the seam extends lower than a bottom of the first source/drain region.

17. A method comprising:
    forming dielectric isolation regions in a semiconductor substrate;
    forming a protruding semiconductor fin protruding higher than the dielectric isolation regions;
    forming a dummy gate stack over a top surface and on sidewalls of the protruding semiconductor fin;
    forming a first gate spacer and a second gate spacer opposing to each other, wherein sidewalls of the first gate spacer and the second gate spacer contact sidewalls of the dummy gate stack to form vertical interfaces;

forming a fin isolation region between, and contacting, the first gate spacer and the second gate spacer, wherein the fin isolation region comprises a seam therein;

depositing an etch stop layer over and contacting one of the dielectric isolation regions, wherein the seam remains after the etch stop layer is deposited, and wherein the seam has a height-to-width ratio greater than about 10; and forming a first source/drain region and a second source/drain region extending into the protruding semiconductor fin, wherein the first source/drain region and the second source/drain region are on opposite sides of the fin isolation region.

18. The method of claim 17, wherein the forming the fin isolation region comprises:

performing an anisotropic etching process to form a trench by removing the dummy gate stack between the first gate spacer and the second gate spacer, and removing a portion of the semiconductor substrate directly underlying the dummy gate stack; and filling the trench with a plurality of dielectric layers.

19. The method of claim 18, wherein the forming the fin isolation region further comprises:

after the anisotropic etching process, performing an isotropic etching process to expand a lower portion of the trench, wherein the filling the trench comprises performing a conformal deposition process.

20. The method of claim 18, wherein the filling the trench with the plurality of dielectric layers is performed through a plurality of conformal deposition processes.

\* \* \* \* \*